(12) United States Patent
Schick et al.

(10) Patent No.: US 12,386,188 B2
(45) Date of Patent: Aug. 12, 2025

(54) PROJECTOR FOR ILLUMINATING AT LEAST ONE OBJECT

(71) Applicant: TRINAMIX GMBH, Ludwigshafen am Rhein (DE)

(72) Inventors: Jens Schick, Karlsruhe (DE); Raimund Hibst, Ulm (DE); Detlef Russ, Ulm (DE); Daniel Claus, Ulm (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 750 days.

(21) Appl. No.: 17/754,437

(22) PCT Filed: Oct. 6, 2020

(86) PCT No.: PCT/EP2020/077915
§ 371 (c)(1),
(2) Date: Apr. 1, 2022

(87) PCT Pub. No.: WO2021/069400
PCT Pub. Date: Apr. 15, 2021

(65) Prior Publication Data
US 2022/0350156 A1 Nov. 3, 2022

(30) Foreign Application Priority Data
Oct. 7, 2019 (EP) .................................. 19201691

(51) Int. Cl.
*H01S 5/42* (2006.01)
*G01B 11/25* (2006.01)
(Continued)

(52) U.S. Cl.
CPC .......... *G02B 27/0922* (2013.01); *G01B 11/25* (2013.01); *G01S 17/48* (2013.01); *H01S 5/183* (2013.01)

(58) Field of Classification Search
CPC ....................... G02B 27/0922; G02B 27/0927; G01B 11/25; G01B 11/254; G01S 17/48; G01S 7/4815; H01S 5/183
See application file for complete search history.

(56) References Cited

U.S. PATENT DOCUMENTS

2015/0362585 A1 12/2015 Ghosh et al.
2016/0178915 A1 6/2016 Mor et al.
(Continued)

FOREIGN PATENT DOCUMENTS

WO 2009153446 A2 12/2009
WO 2012110924 A1 8/2012
(Continued)

OTHER PUBLICATIONS

R.A. Street (Ed.): Technology and Applications of Amorphous Silicon, Springer-Verlag Heidelberg, 2010, pp. 346-349.
(Continued)

*Primary Examiner* — Yuanda Zhang
(74) *Attorney, Agent, or Firm* — Armstrong Teasdale LLP

(57) ABSTRACT

Disclosed herein is a projector for illuminating at least one object with at least one illumination pattern. The projector includes at least one array of vertical-cavity surface-emitting lasers (VCSELs). Each of the VCSELs is configured for generating at least one light beam. The projector includes at least one optical system configured for generating a characteristic beam profile for each of the light beams generated by the VCSELs of the array. The beam profile of neighboring VCSELs of the array differs in lateral and/or axial direction such that light beams of the VCSELs of the array are assignable to the corresponding VCSEL in three-dimensional space.

14 Claims, 4 Drawing Sheets

(51) Int. Cl.
*G01S 17/48* (2006.01)
*G02B 27/09* (2006.01)
*H01S 5/183* (2006.01)

(56) References Cited

U.S. PATENT DOCUMENTS

| | | | | |
|---|---|---|---|---|
| 2016/0274679 | A1* | 9/2016 | Romano | H04N 13/254 |
| 2018/0210064 | A1* | 7/2018 | Send | G01C 3/32 |
| 2022/0146250 | A1* | 5/2022 | Bonsignore | G01B 11/03 |

FOREIGN PATENT DOCUMENTS

| | | | |
|---|---|---|---|
| WO | 2014097181 A1 | 6/2014 | |
| WO | 2014198629 A1 | 12/2014 | |
| WO | 2016131658 A1 | 8/2016 | |
| WO | 2016154218 A1 | 9/2016 | |
| WO | 2017222618 A1 | 12/2017 | |
| WO | 2018091638 A1 | 5/2018 | |
| WO | 2018091640 A2 | 5/2018 | |
| WO | WO-2018091649 A1 * | 5/2018 | G01J 1/0411 |
| WO | 2019011803 A1 | 1/2019 | |

OTHER PUBLICATIONS

Subbaro, M. and Gopal, S., Depth from Defocus: A Spatial Domain Approach, International Journal of Computer Vision, 13, 3, 271-294, 1994.

J. Gavin in Optics Letters, vol. 36 (2011), Nr. 13, 2495-2497.

"Vertical-cavity surface-emitting laser", Wikipedia, available at <https://en.wikipedia.org/wiki/Vertical-cavity_surface-emitting_laser>.

"Optical constants of BK7: N-BK7 (Schott)", Refractive Index Database, available at <https://refractiveindex.info/?shelf=glass&book=BK7&page=SCHOTT>.

International Search Report and Written Opinion for corresponding PCT/EP2020/077915 mailed Jan. 29, 2021; 10 pages.

\* cited by examiner

PROJECTOR FOR ILLUMINATING AT LEAST ONE OBJECT

CROSS-REFERENCE TO RELATED APPLICATIONS

This application is a U.S. National Phase Application of International Patent Application No. PCT/EP2020/077915, filed Oct. 6, 2020, which claims priority to European Patent Application No. 19201691.3, filed Oct. 7, 2019, each of which is hereby incorporated by reference herein.

FIELD OF THE INVENTION

The invention relates to a projector, a detector and a method for determining a position of at least one object. The devices, methods and uses according to the present invention specifically may be employed for example in various areas of daily life, gaming, traffic technology, production technology, security technology, photography such as digital photography or video photography for arts, documentation or technical purposes, medical technology, home care, smart living or in the sciences. Further, the invention specifically may be used for scanning one or more objects and/or for scanning a scenery, such as for generating a depth profile of an object or of a scenery, e.g. in the field of architecture, metrology, archaeology, arts, medicine, engineering or manufacturing. However, other applications are also possible.

PRIOR ART

A large number of optical devices and methods are known from the prior art using structured light methods for 3D-measurements. Typically, in these devices and methods a point pattern is projected and the reflected pattern is recorded and evaluated. The pattern, for example, is generated by combining a light emitting diode (LED) and a diffractive optical element (DOE). However, for complex objects the so-called correspondence problem has to be solved, i.e. which point of the object was generated by which light beam. Several methods for solving the correspondence problem are known, which are, however, complex and time consuming.

US 2016/178915 describes an optoelectronic device, which includes a semiconductor substrate, an array of optical emitters arranged on the substrate in a two-dimensional pattern, a projection lens and a diffractive optical element (DOE). The projection lens is mounted on the semiconductor substrate and is configured to collect and focus light emitted by the optical emitters so as to project optical beams containing a light pattern corresponding to the two-dimensional pattern of the optical emitters on the substrate. The DOE is mounted on the substrate and is configured to produce and project multiple overlapping replicas of the pattern.

WO 2016/154218 A1 describes a tracking system which generates a structured light pattern in a local area. The system includes an array of lasers that generate light. The array of lasers includes a plurality of lasers and an optical element. The plurality of lasers are grouped into at least two subsets of lasers, and each of the at least two subsets of lasers is independently switchable. The optical element includes a plurality of cells that are each aligned with a respective subset of the array of lasers. Each cell receives light from a corresponding laser of the array of lasers, and each cell individually applies a modulation to the received light passing through the cell to form a corresponding portion of the structured light pattern that is projected onto a local area.

WO 2009/153446 A2 describes a device for projecting structured light in the form of fringes or other patterns using laser sources, which includes an optical head including three consecutive elements mounted on a substrate, i.e. a laser source including VCSELs, a collimation diffractive optical element and a light-structuring diffractive optical element. The laser source includes at least one VCSEL matrix obtained by combining M bars of N VCSELs in order to obtain (M×N) VCSELs. The diffractive optical elements are phase diffractive optical elements that convert the light emitted by the laser source into a structured light pattern. They are made of matrices of (M×N) diffractive optical sub-elements mounted in front of each VCSEL, and are connected to the laser source in order to define an integrated optical head.

Problem Addressed by the Invention

It is therefore an object of the present invention to provide devices and methods facing the above-mentioned technical challenges of known devices and methods. Specifically, it is an object of the present invention to provide devices and methods which allow reliable determining a position of an object in space, preferably with a low technical effort and with low requirements in terms of technical resources and cost.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

As used in the following, the terms "have", "comprise" or "include" or any arbitrary grammatical variations thereof are used in a non-exclusive way. Thus, these terms may both refer to a situation in which, besides the feature introduced by these terms, no further features are present in the entity described in this context and to a situation in which one or more further features are present. As an example, the expressions "A has B", "A comprises B" and "A includes B" may both refer to a situation in which, besides B, no other element is present in A (i.e. a situation in which A solely and exclusively consists of B) and to a situation in which, besides B, one or more further elements are present in entity A, such as element C, elements C and D or even further elements.

Further, it shall be noted that the terms "at least one", "one or more" or similar expressions indicating that a feature or element may be present once or more than once typically will be used only once when introducing the respective feature or element. In the following, in most cases, when referring to the respective feature or element, the expressions "at least one" or "one or more" will not be repeated, non-withstanding the fact that the respective feature or element may be present once or more than once.

Further, as used in the following, the terms "preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restrictions regarding the scope of the invention and without any restriction regarding the possibility of combining the features introduced in such a way with other optional or non-optional features of the invention.

In a first aspect of the present invention a projector for illuminating at least one object with at least one illumination pattern is disclosed.

As used herein, the term "object" may refer to an arbitrary object, in particular a surface or region, which is configured to reflect at least partially at least one light beam impinging on the object. The light beam may originate from the projector illuminating the object, wherein the light beam is reflected or scattered by the object. As used herein, the term "projector", also denoted as light projector, may refer to an optical device configured to project at least one illumination pattern onto the object, specifically onto a surface of the object.

The projector comprises at least one array of vertical-cavity surface-emitting lasers (VCSELs). Each of the VCSELs is configured for generating at least one light beam. The projector comprises at least one optical system configured for generating a characteristic beam profile for each of the light beams generated by the VCSELs of the array. Cyclic or random repetitions of the beam profiles within the pattern may be possible. The beam profile of neighboring VCSELs of the array differs in lateral and/or axial direction such that light beams of the VCSELs of the array are assignable to the corresponding VCSEL in three-dimensional space.

As used herein, the term "pattern" may refer to an arbitrary known or pre-determined arrangement comprising a plurality of arbitrarily shaped features such as symbols. The pattern may comprise a plurality of features. The pattern may comprise an arrangement of periodic or non-periodic features. As used herein, the term "illumination pattern" refers to a pattern which illuminates the object. In particular, the illumination pattern refers to a single beam generated by one of the VCSELs and its pattern, whereas the collective or entirety of all illumination patterns generated by the array of VCSELs may be denoted as collective illumination pattern. The illumination pattern may comprise at least one pattern selected from the group consisting of: at least one point pattern, in particular a pseudo-random point pattern; a random point pattern or a quasi random pattern; at least one Sobol pattern; at least one quasiperiodic pattern; at least one pattern comprising at least one pre-known feature at least one regular pattern; at least one triangular pattern; at least one hexagonal pattern; at least one rectangular pattern at least one pattern comprising convex uniform tilings; at least one line pattern comprising at least one line; at least one line pattern comprising at least two lines such as parallel or crossing lines. For example, the projector may be configured for generate and/or to project a cloud of points or non-point-like features. For example, the projector may be configured for generate a cloud of points or nonpoint-like features such that the illumination pattern may comprise a plurality of point features or non-point-like features. The illumination pattern may comprise regular and/or constant and/or periodic patterns such as a triangular pattern, a rectangular pattern, a hexagonal pattern, or a pattern comprising further convex tilings. The illumination pattern may comprise as many features per area as possible such that a hexagonal pattern may be preferred. A distance between two features of the respective illumination pattern and/or an area of the at least one illumination feature may depend on a circle of confusion in an image determined by at least one detector as described below.

The projector comprises at least one array of vertical-cavity surface-emitting lasers (VCSELs). As used herein, the term "vertical-cavity surface-emitting laser" refers to a semiconductor laser diode configured for laser beam emission perpendicular with respect to a top surface. Examples for VCSELs can be found e.g. in https://en.wikipedia.org/wikiNertical-cavity_surface-emitting_laser. VCSELs are generally known to the skilled person such as from WO 2017/222618 A.

Each of the VCSELs is configured for generating at least one light beam. As used herein, the term "ray" generally refers to a line that is perpendicular to wavefronts of light which points in a direction of energy flow. As used herein, the term "beam" generally refers to a collection of rays. In the following, the terms "ray" and "beam" will be used as synonyms. As further used herein, the term "light beam" generally refers to an amount of light, specifically an amount of light traveling essentially in the same direction, including the possibility of the light beam having a spreading angle or widening angle.

The VCSELs may be configured for emitting light beams at a wavelength range from 800 to 1000 nm. For example, the VCSELs may be configured for emitting light beams at 808 nm, 850 nm, 940 nm, or 980 nm. Preferably the VCSELs emit light at 940 nm, since terrestrial sun radiation has a local minimum in irradiance at this wavelength, e.g. as described in CIE 085-1989 "Solar spectral Irradiance".

The array of VCSELs may be a two-dimensional or one dimensional array. The array of VCSELs may comprise a plurality of VCSELs arranged in a matrix. As further used herein, the term "matrix" generally refers to an arrangement of a plurality of elements in a predetermined geometrical order. The matrix specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point.

For example, the matrix may be a single row of pixels. Other arrangements are feasible. The VCSELs may be arranged on a common substrate or on different substrates. The array may comprise up to 2500 VCSELs. For example, the array may comprise 38×25 VCSELs, such as a high power array with 3.5 W. For example, the array may comprise 10×27 VCSELs with 2.5 W. For example, the array may comprise 96 VCSELs with 0.9 W. A size of the array, e.g. of 2500 elements, may be up to 2 mm×2 mm.

The array of VCSELs may have in comparison to light emitting diodes (LEDs) a high radiant power. Moreover, the VCSELs may have higher spatial and temporal coherence in comparison to LEDs. This may allow improved shaping and/or modifying of the beam profile by the optical system and an increased spectral power density.

The projector comprises at least one optical system configured for generating a characteristic beam profile for each of the light beams generated by the VCSELs of the array. As used herein, the term "optical system" generally refers to at least one optical device comprising at least two components. The optical system may comprise at least one array of optical elements. The array of optical elements may comprise a plurality of optical elements arranged in a matrix. The matrix of optical elements specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point. For example, the matrix may be a single row of pixels. Other arrangements are feasible.

As used herein, the term "beam profile" relates to a spatial distribution, in particular in at least one plane perpendicular to the propagation of the light beam, of an intensity of the light beam. The beam profile may be a transverse intensity profile of the light beam. The beam profile may be a cross section of the light beam. The beam profile may be selected from the group consisting of a trapezoid beam profile; a triangle beam profile; a conical beam profile and a linear combination of Gaussian beam profiles. Other embodiments are feasible, however. As used herein, the term "characteristic beam profile" relates to the fact that beam profiles of VCSELs of the array, in particular beam profiles of neighboring VCSELs, differ. The beam profile of neighboring VCSELs of the array differs in lateral and/or axial direction. As used herein, the term "axial direction" a direction along an optical axis of the optical system, in particular a longitudinal direction. As used herein, the term "optical axis" generally refers to an axis of mirror symmetry or rotational symmetry of the optical system. The optical axis may be a line of symmetry of the optical setup of the optical system. As used herein, the term "lateral direction" refers to a direction perpendicular to the axial direction, in particular a transversal direction. The beam profiles of VCSELs of the array, in particular of neighboring VCSELs of the array, may differ by one or more of shape, orientation, cross section. The lateral and axial directions constitute the three-dimensional space. As used herein, the term "shape" generally refers to a spatial distribution, in particular in at least one plane perpendicular to the propagation of the light beam, of an intensity of the light beam such as extension and/or contour. As used herein, the term "orientation" generally refers to direction of propagation of the light beam with respect to the optical axis of the optical system, in particular to an angle between the direction of propagation of the light beam and the optical axis. As used herein, the term "cross section" generally refers to an area of the light beam in at least one plane perpendicular to the propagation of the light beam. The different beam profiles allow assigning light beams generated by the VCSELs of the array to the corresponding VCSEL. In particular, if neighboring light beams differ in shape, it is possible to determine from which VCSEL of the array a light beam was generated from the shape of the light beam. For example, the light beams may differ in shape and orientation. Preferably, the differences of the beam profiles are as large as possible in order to allow simple assignment. The assignment may be simplest, in case the beam profiles of all VCSELs of the array differ in shape, orientation and cross section. However, it may be sufficient that beam profiles of neighboring light beams differ in at least one parameter.

Light generated by the individual VCSELs may not overlay or merge with light of the other VCSELs to a common pattern. The contrary, the beam profile of each VCSELs may remain recognizable on its own. This may allow that beam profiles of neighboring VCSELs differ such that they are distinguishable and the beam profile of the respective generated light beam change in direction of propagation of the light beam enhancing distance determination. The present invention proposes, in particular, that each VCSEL has an individual optical element. This is in contrast to known devices. For example, WO 2016/154218 A1 describes 3D measurement using structured light, wherein it is necessary to perform sequentially a plurality of images with different patterns. For this procedure, the Lasers of the array proposed in WO 2016/154218 A1 are divided into at least two subgroups which are independently switchable. The lasers of each subgroup share a common optic. Thus, in contrast to the device proposed in WO 2016/154218 A1, the present invention requires only a single image. A temporal modulation of Laser or pattern is not necessary.

Each of the optical elements may have a structured surface. The structured surfaces of the optical elements may differ. In particular, the structured surfaces of two neighboring optical elements of the array may differ. As used herein, the term "structured surface" generally may refer to a surface of the optical element having a pre-defined arbitrary structure. The structured surface may be an individual printed and/or embossed structure. However, other manufacturing techniques such as molding or injection molding may be possible. The optical elements may be manufactured or produced by using three-dimensional holographic lithography, such as described in J. Gavin in Optics Letters, Vol. 36 (2011), Nr. 13, 2495-2497.

The optical elements each may be or may comprise at least one lens having a structured surface. The structured surface may a surface with an individual imprinted and/or embossed structure. However, other manufacturing techniques such as molding or injection molding are possible. The structured surface may result in that a light beam impinging on the optical element is adjusted to have a non-pointlike or non-punctiform beam profile. The optical elements may be refractive optical elements. Preferably, the optical elements may be refractive-diffractive hybrid-elements. As used herein, the term "refractive optical element" refers to a structured surface having at least one refractive structure. As used herein, the term "refractive-diffractive hybrid-elements" refers to a structured surface having at least one refractive structure and at least one diffractive structure or a structure having both refractive and diffractive properties. The refractive elements and/or refractive structures may have a radius, in particular a diameter e.g. of the micro lens, depending on the distance between neighboring VCSELs. For example, the distance may range from 40 µm to 70 µm. The diameter may be similar such as 40 µm. However, the diameter may furthermore depend strongly on optical properties and refractive index. The diffractive elements and/or diffractive structures may be advantageous since they can be produced very flat. The diffractive elements each may comprise at least one base plate, also denoted as substrate. The base plate may be a glass base plate. The base plate may have a thickness of 1 mm. The refractive elements and/or refractive structures may have a thickness $D_{diff}$, which corresponds to the phase difference of $2\pi$ due to the optical path difference $D_{diff}=(n-1)\lambda/2\pi$. The diameter of the diffractive and refractive elements and/or structures may be smaller than the distance between two VCSELs of the array, e.g. the diameter may be smaller than 70 µm. The diffractive elements and/or structures may be circular symmetrical and planar. However, non-symmetrical embodiments are possible. For example, diffractive structures may be arranged on a curved surface such as of a concave or convex side of a refractive lens.

The optical elements may comprise at least one material comprising at least one polymer. The material may be a polymer material which may be used for 2-photon stimulation polymerization such as Nanoscribe IP-Dip, Ormo-Comp., Nanoscribe IP-G, Nanoscribe IP-L, Nanoscribe IP-S. For molding process, such as injection molding or hot embosing and the like, plastics may be used such as available from Zeonix, https://www.zeonex.com/optics.aspx.html, or Trogamid myCX from Evonik, https://www.campusplastics.com/campus/de/datasheet/TROGAMID % C2%AE+myCX+nc+(nf)/Evonik+Industries+AG/66/bf801790. For glass molding several glass materials can be used such as glass materials listed in https://refractiveindex.info/?shelf=glass&book=BK7&page=SCHOTT.

The optical elements may be arranged as close as possible in a direction of propagation of the light beams in front of the array of VCSELs. For example, the optical elements may be designed as rod lenses having a high refractive index. The rod lenses may be arranged as close as possible in a direction of propagation of the light beams in front of the array of VCSELs. Due to the higher refractive index of the lens material a convergence angle may be reduced and the optical path length may be increased such that local coherence is increased allowing improved shaping of the light beam.

The structured surface may be configured such that the cross section of the beam profile may differ dependent on distance between the projector and the object. This may be ensured by using optical elements having a specific pre-defined and/or pre-determined geometry. The required geometry may be determined by using an iterative wave-optical calculation. In particular, desired intensity distributions at different distances with respect to the optical elements may be used as a basis of the iterative design. Between different planes, e.g. VCSEL, optical element, projection plane with shape 1 and projection plane with shape 2, at least one wave-optical propagation algorithm such as Fresnel propagation, or Rayleigh-Sommerfeld diffraction integral, may be used. Said propagation may run from plane to plane and back to the VCSEL. Since the VCSEL may emit partial coherent radiation, it is possible for using point-light sources for simulation which are non-coherent between each other. Said point-light sources may be weighted with respect to their intensity distribution.

The present invention distinguishes from conventional stripe projection. The illumination pattern may comprise different and separated features which do not touch or overlap with each other. Specifically, the illumination pattern may not comprise closed features which were generated via overlay or superposition of radiation of neighboring vertical-cavity surface-emitting lasers.

Each VCSEL may generate a closed and separate feature. The number of generated features may, thus, correspond to the number of VCSELs. By requiring that the optical system is configured for generating a characteristic beam profile for each of the light beams generated by the VCSELs of the array it may be possible to identify and/or localize light emitted by each of the VCSELs. The generated beam profile of neighboring individual VCSELs differ, in particular the beam profile of the neighboring VCSELs of the array differs in lateral and/or axial direction. For studying of a 3D space using projections of different features in lateral and/or axial direction, the light beams of the VCSELs are assignable to the corresponding VCSEL in three-dimensional space. The micro-optical element of each of the VCSELs may generate not only one pattern but several patterns, e.g. axial and/or lateral displaced.

The optical system may be configured for generating a plurality of illumination patterns in lateral dimension. As used herein, the term "lateral dimension" refers to a dimension perpendicular to the axial direction, in particular a transversal dimension. For example, the optical system may be configured for generating for each of the VCSELs of the array at least two illumination features having different angles with respect to the optical axis. For example, this can be realized using raytracing routines such as enabled by the commercial software package from Zemax®. Additionally or alternatively, it may be possible to use an iterative approach based on at least one wave-optical propagation method such as Rayleigh-Sommerfeld, Fresnel propagation and/or Fraunhofer propagation. The iterative process then may alternate between the propagation from the optical system to the different laterally projected illumination patterns and back to the optical system. During an update process of the optical system the number of the different lateral illumination patterns may be accounted resulting in a certain percentage that each illumination pattern contributes to the updated optical systems e.g. if two illumination patterns shall be produced with equal weight, the corresponding retrieved wave-optical solutions in each iterative step will contribute to the wave optical description of the optical system by 50%. This process may be repeated until the error measure could be minimized for all projected illumination patterns. The error measure may be obtained from the difference between the desired illumination pattern to the simulated illumination pattern. A projection direction between the at least two illumination patterns may not be too large. The two patterns can be projected in the same plane. Hence, the iterative process will only take place between the optical system and the plane of the desired at least two illumination patterns.

The optical system may be configured for generating a plurality of different illumination patterns in axial dimension. As used herein, the term "axial dimension" refers to a dimension along the optical axis of the optical system, in particular a longitudinal dimension. The optical system may be configured for focusing the different illumination patterns for each VCSEL on different depth of fields. Specifically, the optical system may be configured for focusing the illumination patterns at different focus planes, in particular object planes, wherein the focus planes are planes perpendicular to the optical axis of the optical system having different coordinates along the optical axis. The optical system may be configured such that in each of the focus planes only one illumination pattern of the illumination patterns is focused, whereas the other illumination patterns are non-focused. The optical system may be configured such that in each of the focus planes a different illumination pattern is focused. The optical system may comprise at least one device for intermediate projection of the illumination pattern. For example, for application with distances of a few meters between the array of VCSELs and the object, the device for intermediate projection may be designed as telecentric imaging, such that the size of the features of the imaged pattern is unchanged for all axial object positions. Additionally or alternatively, imaging scales may be determined from design data or by calibration. The plurality of different illumination patterns in axial dimension may allow using triangulation methods and/or methods at which detector and projector are aligned, in particular on a common axis. For this purpose, the detector may comprise at least one zoom optics and/or at least one electro-optical tunable system for traversing the measuring range. By adjusting the different illumination patterns for different depths of the VCSELs of the array, it may be possible to increase the number of distinguishable depth steps over the depth of field range of the detector to the number of VCSELs in the array.

For example, the optical system may be configured for generating a plurality of different illumination patterns in axial dimension. Each of the said different illumination patterns may comprises a number of spots.

For example, the optical system may be configured for generating a plurality of different illumination patterns in axial dimension. Each of the said different illumination patterns may be asymmetric and may comprise a number of spots.

For example, the optical system may be configured for generating a plurality of different illumination patterns in the lateral dimensions. Each of the said different illumination patterns may comprise a number of spots.

For example, the optical system may be configured for generating a plurality of different illumination patterns in the lateral dimensions. Each of the said different illumination patterns may be asymmetric and comprises a number of spots.

In a further aspect of the present invention, a detector for determining a position of at least one object is disclosed. The detector comprises at least one projector according to the present invention, such as according to one or more of the embodiments disclosed above or according to one or more of the embodiments disclosed in further detail below.

As used herein, the term "position" refers to at least one item of information regarding a location and/or orientation of the object and/or at least one part of the object in space. Thus, the at least one item of information may imply at least one distance between at least one point of the object and the at least one detector. The item of information may, in particular refer to x, y and z coordinates of that object point in space. The distance may be a longitudinal coordinate or may contribute to determining a longitudinal coordinate of the point of the object. Additionally or alternatively, one or more other items of information regarding the location and/or orientation of the object and/or at least one part of the object may be determined. As an example, additionally, at least one transversal coordinate of the object and/or at least one part of the object may be determined. Thus, the position of the object may imply at least one longitudinal coordinate of the object and/or at least one part of the object. Additionally or alternatively, the position of the object may imply at least one transversal coordinate of the object and/or at least one part of the object. Additionally or alternatively, the position of the object may imply at least one orientation information of the object, indicating an orientation of the object in space.

The detector comprises:
- at least one projector for illuminating the object with at least one illumination pattern according to the present invention;
- at least one sensor element having a matrix of optical sensors, the optical sensors each having a light-sensitive area, wherein each optical sensor is designed to generate at least one sensor signal in response to an illumination of its respective light-sensitive area by a reflection light beam propagating from the object to the detector, wherein the sensor element is configured to determine at least one reflection image;
- at least one evaluation device, wherein the evaluation device is configured for selecting at least one reflection feature of the reflection image and for assigning said reflection feature to one of the VCSELs of the array.

As used herein, the term "sensor element" generally refers to a device or a combination of a plurality of devices configured for sensing at least one parameter. In the present case, the parameter specifically may be an optical parameter, and the sensor element specifically may be an optical sensor element. The sensor element may be formed as a unitary, single device or as a combination of several devices. As further used herein, the term "matrix" generally refers to an arrangement of a plurality of elements in a predetermined geometrical order. The matrix, as will be outlined in further detail below, specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point. For example, the matrix may be a single row of pixels. Other arrangements are feasible.

As used herein, an "optical sensor" generally refers to a light-sensitive device for detecting a light beam, such as for detecting an illumination and/or a light spot generated by at least one light beam. As further used herein, a "light-sensitive area" generally refers to an area of the optical sensor which may be illuminated externally, by the at least one light beam, in response to which illumination the at least one sensor signal is generated. The light-sensitive area may specifically be located on a surface of the respective optical sensor. Other embodiments, however, are feasible. The optical sensors of the matrix specifically may be equal in one or more of size, sensitivity and other optical, electrical and mechanical properties. The light-sensitive areas of all optical sensors of the matrix specifically may be located in a common plane, the common plane preferably facing the object, such that a light beam propagating from the object to the detector may generate a light spot on the common plane.

As used herein, the term "the optical sensors each having at least one light sensitive area" refers to configurations with a plurality of single optical sensors each having one light sensitive area and to configurations with one combined optical sensor having a plurality of light sensitive areas. Thus, the term "optical sensor" furthermore refers to a light-sensitive device configured to generate one output signal, whereas, herein, a light-sensitive device configured to generate two or more output signals, for example at least one CCD and/or CMOS device, is referred to as two or more optical sensors. Each optical sensor may be embodied such that precisely one light-sensitive area is present in the respective optical sensor, such as by providing precisely one light-sensitive area which may be illuminated, in response to which illumination precisely one uniform sensor signal is created for the whole optical sensor. Thus, each optical sensor may be a single area optical sensor. The use of the single area optical sensors, however, renders the setup of the detector specifically simple and efficient. Thus, as an example, commercially available photo-sensors, such as commercially available silicon photodiodes, each having precisely one sensitive area, may be used in the setup. Other embodiments, however, are feasible. Thus, as an example, an optical device comprising two, three, four or more than four light-sensitive areas may be used which is regarded as two, three, four or more than four optical sensors in the context of the present invention. As outlined above, the sensor element comprises a matrix of optical sensors. Thus, as an example, the optical sensors may be part of or constitute a pixelated optical device. As an example, the optical sensors may be part of or constitute at least one CCD and/or CMOS device having a matrix of pixels, each pixel forming a light-sensitive area.

The optical sensors specifically may be or may comprise photodetectors, preferably inorganic photodetectors, more preferably inorganic semiconductor photodetectors, most preferably silicon photodetectors. Specifically, the optical sensors may be sensitive in the infrared spectral range. All of the optical sensors of the matrix or at least a group of the optical sensors of the matrix specifically may be identical. Groups of identical optical sensors of the matrix specifically may be provided for different spectral ranges, or all optical sensors may be identical in terms of spectral sensitivity. Further, the optical sensors may be identical in size and/or with regard to their electronic or optoelectronic properties.

Specifically, the optical sensors may be or may comprise inorganic photodiodes which are sensitive in the infrared spectral range, preferably in the range of 780 nm to 3.0 micrometers. Specifically, the optical sensors may be sensitive in the part of the near infrared region where silicon photodiodes are applicable specifically in the range of 700 nm to 1000 nm. Infrared optical sensors which may be used for optical sensors may be commercially available infrared optical sensors, such as infrared optical sensors commercially available under the brand name Hertzstueck™ from trinamiX GmbH, D-67056 Ludwigshafen am Rhein, Germany. Thus, as an example, the optical sensors may comprise at least one optical sensor of an intrinsic photovoltaic type, more preferably at least one semiconductor photodiode selected from the group consisting of: a Ge photodiode, an InGaAs photodiode, an extended InGaAs photodiode, an InAs photodiode, an InSb photodiode, a HgCdTe photodiode. Additionally or alternatively, the optical sensors may comprise at least one optical sensor of an extrinsic photovoltaic type, more preferably at least one semiconductor photodiode selected from the group consisting of: a Ge:Au photodiode, a Ge:Hg photodiode, a Ge:Cu photodiode, a Ge:Zn photodiode, a Si:Ga photodiode, a Si:As photodiode. Additionally or alternatively, the optical sensors may comprise at least one bolometer, preferably a bolometer selected from the group consisting of a VO bolometer and an amorphous Si bolometer.

The matrix may be composed of independent optical sensors. Thus, a matrix may be composed of inorganic photodiodes. Alternatively, however, a commercially available matrix may be used, such as one or more of a CCD detector, such as a CCD detector chip, and/or a CMOS detector, such as a CMOS detector chip.

Thus, generally, the optical sensors of the detector may form a sensor array or may be part of a sensor array, such as the above-mentioned matrix. Thus, as an example, the detector may comprise an array of optical sensors, such as a rectangular array, having m rows and n columns, with m, n, independently, being positive integers. Preferably, more than one column and more than one row is given, i.e. n>1, m>1. Thus, as an example, n may be 2 to 16 or higher and m may be 2 to 16 or higher. Preferably, the ratio of the number of rows and the number of columns is close to 1. As an example, n and m may be selected such that $0.3 \leq m/n \leq 3$, such as by choosing m/n=1:1, 4:3, 16:9 or similar. As an example, the array may be a square array, having an equal number of rows and columns, such as by choosing m=2, n=2 or m=3, n=3 or the like.

The matrix specifically may be a rectangular matrix having at least one row, preferably a plurality of rows, and a plurality of columns. As an example, the rows and columns may be oriented essentially perpendicular, wherein, with respect to the term "essentially perpendicular", reference may be made to the definition given above. Thus, as an example, tolerances of less than 20°, specifically less than 10° or even less than 5°, may be acceptable. In order to provide a wide range of view, the matrix specifically may have at least 10 rows, preferably at least 50 rows, more preferably at least 100 rows. Similarly, the matrix may have at least 10 columns, preferably at least 50 columns, more preferably at least 100 columns. The matrix may comprise at least 50 optical sensors, preferably at least 100 optical sensors, more preferably at least 500 optical sensors. The matrix may comprise a number of pixels in a multi-mega pixel range. Other embodiments, however, are feasible. Thus, in setups in which an axial rotational symmetry is to be expected, circular arrangements or concentric arrangements of the optical sensors of the matrix, which may also be referred to as pixels, may be preferred.

Preferably, the sensor element may be oriented essentially perpendicular to an optical axis of the detector. Again, with respect to the term "essentially perpendicular", reference may be made to the definition and the tolerances given above. The optical axis may be a straight optical axis or may be bent or even split, such as by using one or more deflection elements and/or by using one or more beam splitters, wherein the essentially perpendicular orientation, in the latter cases, may refer to the local optical axis in the respective branch or beam path of the optical setup.

The reflection light beam may propagate from the object towards the detector. The reflection light beam may originate from the object. The projector may illuminate the object with the at least one illumination pattern and the light is reflected or scattered by the object and, thereby, is at least partially directed as reflection light beams towards the detector.

The reflection light beam specifically may fully illuminate the sensor element such that the sensor element is fully located within the light beam with a width of the light beam being larger than the matrix. Contrarily, preferably, the reflection light beam specifically may create a light spot on the entire matrix which is smaller than the matrix, such that the light spot is fully located within the matrix. This situation may easily be adjusted by a person skilled in the art of optics by choosing one or more appropriate lenses or elements having a focusing or defocusing effect on the light beam, such as by using an appropriate transfer device as will be outlined in further detail below.

As further used herein, a "sensor signal" generally refers to a signal generated by an optical sensor in response to the illumination by the light beam. Specifically, the sensor signal may be or may comprise at least one electrical signal, such as at least one analogue electrical signal and/or at least one digital electrical signal. More specifically, the sensor signal may be or may comprise at least one voltage signal and/or at least one current signal. More specifically, the sensor signal may comprise at least one photocurrent. Further, either raw sensor signals may be used, or the detector, the optical sensor or any other element may be configured for process or preprocess the sensor signal, thereby generating secondary sensor signals, which may also be used as sensor signals, such as preprocessing by filtering or the like.

The light-sensitive areas specifically may be oriented towards the object. As used herein, the term "is oriented towards the object" generally refers to the situation that the respective surfaces of the light-sensitive areas are fully or partially visible from the object. Specifically, at least one interconnecting line between at least one point of the object and at least one point of the respective light-sensitive area may form an angle with a surface element of the light-sensitive area which is different from 0°, such as an angle in the range of 20° to 90°, preferably 80 to 90° such as 90°. Thus, when the object is located on the optical axis or close to the optical axis, the light beam propagating from the object towards the detector may be essentially parallel to the optical axis. As used herein, the term "essentially perpendicular" refers to the condition of a perpendicular orientation, with a tolerance of e.g. ±20° or less, preferably a tolerance of ±10° or less, more preferably a tolerance of ±5° or less. Similarly, the term "essentially parallel" refers to the condition of a parallel orientation, with a tolerance of e.g. ±20° or less, preferably a tolerance of ±10° or less, more preferably a tolerance of ±5° or less.

The optical sensors may be sensitive in one or more of the ultraviolet, the visible or the infrared spectral range. Specifically, the optical sensors may be sensitive in the visible spectral range from 500 nm to 780 nm, most preferably at 650 nm to 750 nm or at 690 nm to 700 nm. Specifically, the optical sensors may be sensitive in the near infrared region. Specifically, the optical sensors may be sensitive in the part of the near infrared region where silicon photodiodes are applicable specifically in the range of 700 nm to 1000 nm. The optical sensors, specifically, may be sensitive in the infrared spectral range, specifically in the range of 780 nm to 3.0 micrometers. For example, the optical sensors each, independently, may be or may comprise at least one element selected from the group consisting of a photodiode, a photocell, a photoconductor, a phototransistor or any combination thereof. For example, the optical sensors may be or may comprise at least one element selected from the group consisting of a CCD sensor element, a CMOS sensor element, a photodiode, a photocell, a photoconductor, a phototransistor or any combination thereof. Any other type of photosensitive element may be used. As will be outlined in further detail below, the photosensitive element generally may fully or partially be made of inorganic materials and/or may fully or partially be made of organic materials. Most commonly, one or more photodiodes may be used, such as commercially available photodiodes, e.g. inorganic semiconductor photodiodes.

As used herein, the term "reflection image" refers to an image determined by the optical sensor comprising a plurality of reflection features. As used herein, the term "reflection feature" refers to a feature in an image plane generated by the object in response to illumination with at least one illumination feature. The reflection image may comprise the at least one reflection pattern comprising the reflection features. As used herein, the term "determining at least one reflection image" refers to one or more of imaging, recording and generating of the reflection image.

As used herein, the term "select at least one reflection feature" refers to one or more of identifying, determining and choosing at least one reflection feature of the reflection image. The evaluation device may be configured for performing at least one image analysis and/or image processing in order to identify the reflection feature. The image analysis and/or image processing may use at least one feature detection algorithm. The image analysis and/or image processing may comprise one or more of the following: a filtering; a selection of at least one region of interest; a formation of a difference image between an image created by the sensor signals and at least one offset; an inversion of sensor signals by inverting an image created by the sensor signals; a formation of a difference image between an image created by the sensor signals at different times; a background correction; a decomposition into color channels; a decomposition into hue; saturation; and brightness channels; a frequency decomposition; a singular value decomposition; applying a Canny edge detector; applying a Laplacian of Gaussian filter; applying a Difference of Gaussian filter; applying a Sobel operator; applying a Laplace operator; applying a Scharr operator; applying a Prewitt operator; applying a Roberts operator; applying a Kirsch operator; applying a high-pass filter; applying a low-pass filter; applying a Fourier transformation; applying a Radon-transformation; applying a Hough-transformation; applying a wavelet-transformation; a thresholding; creating a binary image. The region of interest may be determined manually by a user or may be determined automatically, such as by recognizing an object within an image generated by the optical sensors.

As used herein, the term "assigning said reflection feature to one of the VCSELs of the array" refers to determining, in particular unambiguously, the one VCSEL of the array having emitted the illumination feature having caused the selected reflection feature. In known 3D sensing devices, such as devices using triangulation or structured light techniques, solving this correspondence problem is complex and time consuming. The present invention proposes using characteristic, in particular distinguishable, beam profiles for the illumination features and, thus, for the reflection features such that it is possible to identify the one VCSEL of the array having emitted the illumination feature having caused the selected reflection feature immediately, easily and unambiguously.

The detector may be configured for determining at least one distance information of the object by using triangulation technique and/or depth-from-photon-ratio technique and/or depth from focus and/or depth from defocus.

The evaluation device may be configured for determining at least one longitudinal coordinate $z_{DPR}$ of the selected reflection feature of the reflection image by evaluating a combined signal Q from the sensor signals of the sensor element. As used herein, the term "combined signal Q" refers to a signal which is generated by combining the sensor signals, in particular by one or more of dividing the sensor signals, dividing multiples of the sensor signals or dividing linear combinations of the sensor signals. The evaluation device may be configured for deriving the combined signal Q by one or more of dividing the sensor signals, dividing multiples of the sensor signals, dividing linear combinations of the sensor signals. The evaluation device may be configured for using at least one predetermined relationship between the combined signal Q and the longitudinal coordinate $z_{DPR}$ for determining the longitudinal coordinate. For example, the evaluation device may be configured for deriving the combined signal Q by $$Q(z_O) = \frac{\int\int_{A_1} E(x, y; z_O)dxdy}{\int\int_{A_2} E(x, y; z_O)dxdy},$$

wherein x and y are transversal coordinates, A1 and A2 are different areas of at least one beam profile of the reflection light beam at the sensor position, and $E(x,y,z_o)$ denotes the beam profile given at the object distance $z_o$. Area A1 and area A2 may differ. In particular, A1 and A2 are not congruent. Thus, A1 and A2 may differ in one or more of the shape or content. Generally the beam profile is dependent on luminance $L(z_o)$ and beam shape $S(x,y;z_o)$, $E(x,y;z_o)=L\cdot S$.

Thus, by deriving the combined signal it may allow determining the longitudinal coordinate independent from luminance. In addition, using the combined signal allows determination of the distance $z_o$ independent from the object size. Thus, the combined signal allows determination of the distance $z_o$ independent from the material properties and/or reflective properties and/or scattering properties of the object and independent from alterations of the light source such as by manufacturing precision, heat, water, dirt, damages on the lens, or the like.

Each of the sensor signals may comprise at least one information of at least one area of the beam profile of the light beam. As used herein, the term "area of the beam profile" generally refers to an arbitrary region of the beam profile at the sensor position used for determining the combined signal Q. The light-sensitive areas may be arranged such that a first sensor signal comprises information of a first area of the beam profile and a second sensor signal comprises information of a second area of the beam profile. The first area of the beam profile and second area of the beam profile may be one or both of adjacent or overlapping regions. The first area of the beam profile and the second area of the beam profile may be not congruent in area.

The evaluation device may be configured to determine and/or to select the first area of the beam profile and the second area of the beam profile. The first area of the beam profile may comprise essentially edge information of the beam profile and the second area of the beam profile may comprise essentially center information of the beam profile. The beam profile may have a center, i.e. a maximum value of the beam profile and/or a center point of a plateau of the beam profile and/or a geometrical center of the light spot, and falling edges extending from the center. The second region may comprise inner regions of the cross section and the first region may comprise outer regions of the cross section. As used herein, the term "essentially center information" generally refers to a low proportion of edge information, i.e. proportion of the intensity distribution corresponding to edges, compared to a proportion of the center information, i.e. proportion of the intensity distribution corresponding to the center. Preferably the center information has a proportion of edge information of less than 10%, more preferably of less than 5%, most preferably the center information comprises no edge content. As used herein, the term "essentially edge information" generally refers to a low proportion of center information compared to a proportion of the edge information. The edge information may comprise information of the whole beam profile, in particular from center and edge regions. The edge information may have a proportion of center information of less than 10%, preferably of less than 5%, more preferably the edge information comprises no center content. At least one area of the beam profile may be determined and/or selected as second area of the beam profile if it is close or around the center and comprises essentially center information. At least one area of the beam profile may be determined and/or selected as first area of the beam profile if it comprises at least parts of the falling edges of the cross section. For example, the whole area of the cross section may be determined as first region. The first area of the beam profile may be area A2 and the second area of the beam profile may be area A1.

Other selections of the first area A1 and second area A2 may be feasible. For example, the first area may comprise essentially outer regions of the beam profile and the second area may comprise essentially inner regions of the beam profile. For example, in case of a two-dimensional beam profile, the beam profile may be divided in a left part and a right part, wherein the first area may comprise essentially areas of the left part of the beam profile and the second area may comprise essentially areas of the right part of the beam profile.

The edge information may comprise information relating to a number of photons in the first area of the beam profile and the center information may comprise information relating to a number of photons in the second area of the beam profile. The evaluation device may be configured for determining an area integral of the beam profile. The evaluation device may be configured for determine the edge information by integrating and/or summing of the first area. The evaluation device may be configured for determine the center information by integrating and/or summing of the second area. For example, the beam profile may be a trapezoid beam profile and the evaluation device may be configured for determine an integral of the trapezoid. Further, when trapezoid beam profiles may be assumed, the determination of edge and center signals may be replaced by equivalent evaluations making use of properties of the trapezoid beam profile such as determination of the slope and position of the edges and of the height of the central plateau and deriving edge and center signals by geometric considerations.

Additionally or alternatively, the evaluation device may be configured for determine one or both of center information or edge information from at least one slice or cut of the light spot. This may be realized, for example, by replacing the area integrals in the combined signal Q by a line integral along the slice or cut. For improved accuracy, several slices or cuts through the light spot may be used and averaged. In case of an elliptical spot profile, averaging over several slices or cuts may result in improved distance information.

The evaluation device may be configured to derive the combined signal Q by one or more of dividing the edge information and the center information, dividing multiples of the edge information and the center information, dividing linear combinations of the edge information and the center information. Thus, essentially, photon ratios may be used as the physical basis of the method.

For example, the evaluation device may be configured for evaluating the sensor signals, by a) determining at least one optical sensor having the highest sensor signal and forming at least one center signal;
b) evaluating the sensor signals of the optical sensors of the matrix and forming at least one sum signal;
c) determining at least one combined signal by combining the center signal and the sum signal; and
d) determining the at least one longitudinal coordinate z of the selected feature by evaluating the combined signal.

As explained, e.g. in WO 2012/110924 A1 or WO 2014/097181 A1, typically, a predetermined or determinable relationship exists between a size of a light spot, such as a diameter of the light spot, a beam waist or an equivalent diameter, and the longitudinal coordinate of the object from which the light beam propagates towards the detector. Without wishing to be bound by this theory, the light spot may be characterized by two measurement variables: a measurement signal measured in a small measurement patch in the center or close to the center of the light spot, also referred to as the center signal, and an integral or sum signal integrated over the light spot, with or without the center signal. For a light beam having a certain total power which does not change when the beam is widened or focused, the sum signal should be independent from the spot size of the light spot, and, thus, should, at least when linear optical sensors within their respective measurement range are used, be independent from the distance between the object and the detector. The center signal, however, is dependent on the spot size. Thus, the center signal typically increases when the light beam is focused, and decreases when the light beam is defocused. By comparing the center signal and the sum signal, thus, an item of information on the size of the light spot generated by the light beam and, thus, on the longitudinal coordinate of the object may be generated. The comparing of the center signal and the sum signal, as an example, may be done by forming the combined signal Q out of the center signal and the sum signal and by using a predetermined or determinable relationship between the longitudinal coordinate and the quotient signal for deriving the longitudinal coordinate.

The use of a matrix of optical sensors provides a plurality of advantages and benefits. Thus, the center of the light spot generated by the light beam on the sensor element, such as on the common plane of the light-sensitive areas of the optical sensors of the matrix of the sensor element, may vary with a transversal position of the object. By using a matrix of optical sensors, the detector according to the present invention may adapt to these changes in conditions and, thus, may determine the center of the light spot simply by comparing the sensor signals. Consequently, the detector according to the present invention may, by itself, choose the center signal and determine the sum signal and, from these two signals, derive a combined signal which contains information on the longitudinal coordinate of the object. By evaluating the combined signal, the longitudinal coordinate of the object may, thus, be determined. The use of the matrix of optical sensors, thus, provides a significant flexibility in terms of the position of the object, specifically in terms of a transversal position of the object.

The transversal position of the light spot on the matrix of optical sensors, such as the transversal position of the at least one optical sensor generating the sensor signal, may even be used as an additional item of information, from which at least one item of information on a transversal position of the object may be derived, as e.g. disclosed in WO 2014/198629 A1. Additionally or alternatively, as will be outlined in further detail below, the detector according to the present invention may contain at least one additional transversal detector for, in addition to the at least one longitudinal coordinate, detecting at least one transversal coordinate of the object.

Consequently, in accordance with the present invention, the term "center signal" generally refers to the at least one sensor signal comprising essentially center information of the beam profile. For example, the center signal may be the signal of the at least one optical sensor having the highest sensor signal out of the plurality of sensor signals generated by the optical sensors of the entire matrix or of a region of interest within the matrix, wherein the region of interest may be predetermined or determinable within an image generated by the optical sensors of the matrix. As used herein, the term "highest sensor signal" refers to one or both of a local maximum or a maximum in a region of interest. The center signal may arise from a single optical sensor or, as will be outlined in further detail below, from a group of optical sensors, wherein, in the latter case, as an example, the sensor signals of the group of optical sensors may be added up, integrated or averaged, in order to determine the center signal. The group of optical sensors from which the center signal arises may be a group of neighboring optical sensors, such as optical sensors having less than a predetermined distance from the actual optical sensor having the highest sensor signal, or may be a group of optical sensors generating sensor signals being within a predetermined range from the highest sensor signal. The group of optical sensors from which the center signal arises may be chosen as large as possible in order to allow maximum dynamic range. The evaluation device may be configured for determine the center signal by integration of the plurality of sensor signals, for example the plurality of optical sensors around the optical sensor having the highest sensor signal. For example, the beam profile may be a trapezoid beam profile and the evaluation device may be configured for determine an integral of the trapezoid, in particular of a plateau of the trapezoid.

As outlined above, the center signal generally may be a single sensor signal, such as a sensor signal from the optical sensor in the center of the light spot, or may be a combination of a plurality of sensor signals, such as a combination of sensor signals arising from optical sensors in the center of the light spot, or a secondary sensor signal derived by processing a sensor signal derived by one or more of the aforementioned possibilities. The determination of the center signal may be performed electronically, since a comparison of sensor signals is fairly simply implemented by conventional electronics, or may be performed fully or partially by software. Specifically, the center signal may be selected from the group consisting of: the highest sensor signal; an average of a group of sensor signals being within a predetermined range of tolerance from the highest sensor signal; an average of sensor signals from a group of optical sensors containing the optical sensor having the highest sensor signal and a predetermined group of neighboring optical sensors; a sum of sensor signals from a group of optical sensors containing the optical sensor having the highest sensor signal and a predetermined group of neighboring optical sensors; a sum of a group of sensor signals being within a predetermined range of tolerance from the highest sensor signal; an average of a group of sensor signals being above a predetermined threshold; a sum of a group of sensor signals being above a predetermined threshold; an integral of sensor signals from a group of optical sensors containing the optical sensor having the highest sensor signal and a predetermined group of neighboring optical sensors; an integral of a group of sensor signals being within a predetermined range of tolerance from the highest sensor signal; an integral of a group of sensor signals being above a predetermined threshold.

Similarly, the term "sum signal" generally refers to a signal comprising essentially edge information of the beam profile. For example, the sum signal may be derived by adding up the sensor signals, integrating over the sensor signals or averaging over the sensor signals of the entire matrix or of a region of interest within the matrix, wherein the region of interest may be predetermined or determinable within an image generated by the optical sensors of the matrix. When adding up, integrating over or averaging over the sensor signals, the actual optical sensors from which the sensor signal is generated may be left out of the adding, integration or averaging or, alternatively, may be included into the adding, integration or averaging. The evaluation device may be configured for determine the sum signal by integrating signals of the entire matrix, or of the region of interest within the matrix. For example, the beam profile may be a trapezoid beam profile and the evaluation device may be configured for determine an integral of the entire trapezoid. Further, when trapezoid beam profiles may be assumed, the determination of edge and center signals may be replaced by equivalent evaluations making use of properties of the trapezoid beam profile such as determination of the slope and position of the edges and of the height of the central plateau and deriving edge and center signals by geometric considerations.

Similarly, the center signal and edge signal may also be determined by using segments of the beam profile such as circular segments of the beam profile. For example, the beam profile may be divided into two segments by a secant or a chord that does not pass the center of the beam profile. Thus, one segment will essentially contain edge information, while the other segment will contain essentially center information. For example, to further reduce the amount of edge information in the center signal, the edge signal may further be subtracted from the center signal.

Additionally or alternatively, the evaluation device may be configured for determine one or both of center information or edge information from at least one slice or cut of the light spot. This may be realized for example by replacing the area integrals in the combined signal Q by a line integral along the slice or cut. For improved accuracy, several slices or cuts through the light spot may be used and averaged. In case of an elliptical spot profile, averaging over several slices or cuts may result in an improved distance information.

The combined signal may be a signal which is generated by combining the center signal and the sum signal. Specifically, the combination may include one or more of: forming a quotient of the center signal and the sum signal or vice versa; forming a quotient of a multiple of the center signal and a multiple of the sum signal or vice versa; forming a quotient of a linear combination of the center signal and a linear combination of the sum signal or vice versa. Additionally or alternatively, the combined signal may comprise an arbitrary signal or signal combination which contains at least one item of information on a comparison between the center signal and the sum signal.

The evaluation device may be configured to determine the at least one longitudinal coordinate $z_{DPR}$ of the object by using at least one known, determinable or predetermined relationship between the sensor signals. In particular, the evaluation device is configured to determine the at least one coordinate $z_{DPR}$ of the object by using at least one known, determinable or predetermined relationship between a quotient signal derived from the sensor signals and the longitudinal coordinate.

Raw sensor signals of the optical sensors may be used for evaluation or secondary sensor signals derived thereof. As used herein, the term "secondary sensor signal" generally refers to a signal, such as an electronic signal, more preferably an analogue and/or a digital signal, which is obtained by processing one or more raw signals, such as by filtering, averaging, demodulating or the like. Thus, image processing algorithms may be used for generating secondary sensor signals from the totality of sensor signals of the matrix or from a region of interest within the matrix. Specifically, the detector, such as the evaluation device, may be configured for transforming the sensor signals of the optical sensor, thereby generating secondary optical sensor signals, wherein the evaluation device is configured for performing steps a)-d) by using the secondary optical sensor signals. The transformation of the sensor signals specifically may comprise at least one transformation selected from the group consisting of: a filtering; a selection of at least one region of interest; a formation of a difference image between an image created by the sensor signals and at least one offset; an inversion of sensor signals by inverting an image created by the sensor signals; a formation of a difference image between an image created by the sensor signals at different times; a background correction; a decomposition into color channels; a decomposition into hue; saturation; and brightness channels; a frequency decomposition; a singular value decomposition; applying a Canny edge detector; applying a Laplacian of Gaussian filter; applying a Difference of Gaussian filter; applying a Sobel operator; applying a Laplace operator; applying a Scharr operator; applying a Prewitt operator; applying a Roberts operator; applying a Kirsch operator; applying a high-pass filter; applying a low-pass filter; applying a Fourier transformation; applying a Radon-transformation; applying a Hough-transformation; applying a wavelet-transformation; a thresholding; creating a binary image. The region of interest may be determined manually by a user or may be determined automatically, such as by recognizing an object within an image generated by the optical sensors. As an example, a vehicle, a person or another type of predetermined object may be determined by automatic image recognition within an image, i.e. within the totality of sensor signals generated by the optical sensors, and the region of interest may be chosen such that the object is located within the region of interest. In this case, the evaluation, such as the determination of the longitudinal coordinate, may be performed for the region of interest, only. Other implementations, however, are feasible.

As outlined above, the detection of the center of the light spot, i.e. the detection of the center signal and/or of the at least one optical sensor from which the center signal arises, may be performed fully or partially electronically or fully or partially by using one or more software algorithms. Specifically, the evaluation device may comprise at least one center detector for detecting the at least one highest sensor signal and/or for forming the center signal. The center detector specifically may fully or partially be embodied in software and/or may fully or partially be embodied in hardware. The center detector may fully or partially be integrated into the at least one sensor element and/or may fully or partially be embodied independently from the sensor element.

As outlined above, the sum signal may be derived from all sensor signals of the matrix, from the sensor signals within a region of interest or from one of these possibilities with the sensor signals arising from the optical sensors contributing to the center signal excluded. In every case, a reliable sum signal may be generated which may be compared with the center signal reliably, in order to determine the longitudinal coordinate. Generally, the sum signal may be selected from the group consisting of: an average over all sensor signals of the matrix; a sum of all sensor signals of the matrix; an integral of all sensor signals of the matrix; an average over all sensor signals of the matrix except for sensor signals from those optical sensors contributing to the center signal; a sum of all sensor signals of the matrix except for sensor signals from those optical sensors contributing to the center signal; an integral of all sensor signals of the matrix except for sensor signals from those optical sensors contributing to the center signal; a sum of sensor signals of optical sensors within a predetermined range from the optical sensor having the highest sensor signal; an integral of sensor signals of optical sensors within a predetermined range from the optical sensor having the highest sensor signal; a sum of sensor signals above a certain threshold of optical sensors being located within a predetermined range from the optical sensor having the highest sensor signal; an integral of sensor signals above a certain threshold of optical sensors being located within a predetermined range from the optical sensor having the highest sensor signal. Other options, however, exist.

The summing may be performed fully or partially in software and/or may be performed fully or partially in hardware. A summing is generally possible by purely electronic means which, typically, may easily be implemented into the detector. Thus, in the art of electronics, summing devices are generally known for summing two or more electrical signals, both analogue signals and digital signals. Thus, the evaluation device may comprise at least one summing device for forming the sum signal. The summing device may fully or partially be integrated into the sensor element or may fully or partially be embodied independently from the sensor element. The summing device may fully or partially be embodied in one or both of hardware or software.

As outlined above, the comparison between the center signal and the sum signal specifically may be performed by forming one or more quotient signals. Thus, generally, the combined signal may be a quotient signal Q, derived by one or more of: forming a quotient of the center signal and the sum signal or vice versa; forming a quotient of a multiple of the center signal and a multiple of the sum signal or vice versa; forming a quotient of a linear combination of the center signal and a linear combination of the sum signal or vice versa; forming a quotient of the center signal and a linear combination of the sum signal and the center signal or vice versa; forming a quotient of the sum signal and a linear combination of the sum signal and the center signal or vice versa; forming a quotient of an exponentiation of the center signal and an exponentiation of the sum signal or vice versa. Other options, however, exist. The evaluation device may be configured for forming the one or more quotient signals. The evaluation device may further be configured for determining the at least one longitudinal coordinate by evaluating the at least one quotient signal.

The evaluation device specifically may be configured for using at least one predetermined relationship between the combined signal Q and the longitudinal coordinate $z_{DPR}$, in order to determine the at least one longitudinal coordinate. Thus, due to the reasons disclosed above and due to the dependency of the properties of the light spot on the longitudinal coordinate, the combined signal Q typically is a monotonous function of the longitudinal coordinate of the object and/or of the size of the light spot such as the diameter or equivalent diameter of the light spot. Thus, as an example, specifically in case linear optical sensors are used, a simple quotient of the sensor signal $s_{center}$ and the sum signal $s_{sum}$ $Q=s_{center}/s_{sum}$ may be a monotonously decreasing function of the distance. Without wishing to be bound by this theory, it is believed that this is due to the fact that, in the preferred setup described above, both the center signal $s_{center}$ and the sum signal $s_{sum}$ decrease as a square function with increasing distance to the light source, since the amount of light reaching the detector decreases. Therein, however, the center signal $s_{center}$ decreases more rapidly than the sum signal $s_{sum}$, since, in the optical setup as used in the experiments, the light spot in the image plane grows and, thus, is spread over a larger area. The quotient of the center signal and the sum signal, thus, continuously decreases with increasing diameter of the light beam or diameter of the light spot on the light-sensitive areas of the optical sensors of the matrix. The quotient, further, is typically independent from the total power of the light beam, since the total power of the light beam forms a factor both in the center signal and in the sum sensor signal. Consequently, the combined signal Q may form a secondary signal which provides a unique and unambiguous relationship between the center signal and the sum signal and the size or diameter of the light beam. Since, on the other hand, the size or diameter of the light beam is dependent on a distance between the object, from which the light beam propagates towards the detector, and the detector itself, i.e. dependent on the longitudinal coordinate of the object, a unique and unambiguous relationship between the center signal and the sum signal on the one hand and the longitudinal coordinate on the other hand may exist. For the latter, reference e.g. may be made to one or more of the above-mentioned prior art documents, such as WO 2014/097181 A1. The predetermined relationship may be determined by analytical considerations, such as by assuming a linear combination of Gaussian light beams, by empirical measurements, such as measurements measuring the combined signal and/or the center signal and the sum signal or secondary signals derived thereof as a function of the longitudinal coordinate of the object, or both.

Thus, generally, the evaluation device may be configured for determining the longitudinal coordinate by evaluating the combined signal Q. This determining may be a one-step process, such as by directly combining the center signal and the sum signal and deriving the longitudinal coordinate thereof, or may be a multiple step process, such as by firstly deriving the combined signal from the center signal and the sum signal and, secondly, by deriving the longitudinal coordinate from the combined signal. Both options, i.e. the option of steps c) and d) being separate and independent steps and the option of steps c) and d) being fully or partially combined, shall be comprised by the present invention.

The evaluation device may be configured for using at least one predetermined relationship between the combined signal and the longitudinal coordinate. The predetermined relationship may be one or more of an empiric relationship, a semi-empiric relationship and an analytically derived relationship. The evaluation device may comprise at least one data storage device for storing the predetermined relationship, such as a lookup list or a lookup table.

The combined signal Q may be determined by using various means. As an example, a software means for deriving the quotient signal, a hardware means for deriving the quotient signal, or both, may be used and may be implemented in the evaluation device. Thus, the evaluation device, as an example, may comprise at least one divider, wherein the divider is configured for deriving the quotient signal. The divider may fully or partially be embodied as one or both of a software divider or a hardware divider. The divider may fully or partially be integrated into the sensor element answers or may fully or partially be embodied independent from the sensor element.

The detector may comprise at least one further optical element selected from the group consisting of: transfer device, such as at least one lens and/or at least one lens system, at least one diffractive optical element. The term "transfer device", also denoted as "transfer system", may generally refer to one or more optical elements which are configured for modify the light beam, such as by modifying one or more of a beam parameter of the light beam, a width of the light beam or a direction of the light beam. The transfer device may be configured for guide the light beam onto the optical sensors. The transfer device specifically may comprise one or more of: at least one lens, for example at least one lens selected from the group consisting of at least one focus-tunable lens, at least one aspheric lens, at least one spheric lens, at least one Fresnel lens; at least one diffractive optical element; at least one concave mirror; at least one beam deflection element, preferably at least one mirror; at least one beam splitting element, preferably at least one of a beam splitting cube or a beam splitting mirror; at least one multi-lens system. As used herein, the term "focal length" of the transfer device refers to a distance over which incident collimated rays which may impinge the transfer device are brought into a "focus" which may also be denoted as "focal point". Thus, the focal length constitutes a measure of an ability of the transfer device to converge an impinging light beam. Thus, the transfer device may comprise one or more imaging elements which can have the effect of a converging lens. By way of example, the transfer device can have one or more lenses, in particular one or more refractive lenses, and/or one or more convex mirrors. In this example, the focal length may be defined as a distance from the center of the thin refractive lens to the principal focal points of the thin lens. For a converging thin refractive lens, such as a convex or biconvex thin lens, the focal length may be considered as being positive and may provide the distance at which a beam of collimated light impinging the thin lens as the transfer device may be focused into a single spot. Additionally, the transfer device can comprise at least one wavelength-selective element, for example at least one optical filter. Additionally, the transfer device can be designed to impress a predefined beam profile on the electromagnetic radiation, for example, at the location of the sensor region and in particular the sensor area. The abovementioned optional embodiments of the transfer device can, in principle, be realized individually or in any desired combination.

The transfer device may have an optical axis. In particular, the detector and the transfer device have a common optical axis. As used herein, the term "optical axis of the transfer device" generally refers to an axis of mirror symmetry or rotational symmetry of the lens or lens system. The optical axis of the detector may be a line of symmetry of the optical setup of the detector. The detector comprises at least one transfer device, preferably at least one transfer system having at least one lens. The transfer system, as an example, may comprise at least one beam path, with the elements of the transfer system in the beam path being located in a rotationally symmetrical fashion with respect to the optical axis. Still, one or more optical elements located within the beam path may also be off-centered or tilted with respect to the optical axis. In this case, however, the optical axis may be defined sequentially, such as by interconnecting the centers of the optical elements in the beam path, e.g. by interconnecting the centers of the lenses, wherein, in this context, the optical sensors are not counted as optical elements. The optical axis generally may denote the beam path. Therein, the detector may have a single beam path along which a light beam may travel from the object to the optical sensors, or may have a plurality of beam paths. As an example, a single beam path may be given or the beam path may be split into two or more partial beam paths. In the latter case, each partial beam path may have its own optical axis. The optical sensors may be located in one and the same beam path or partial beam path. Alternatively, however, the optical sensors may also be located in different partial beam paths.

The transfer device may constitute a coordinate system, wherein a longitudinal coordinate I is a coordinate along the optical axis and wherein d is a spatial offset from the optical axis. The coordinate system may be a polar coordinate system in which the optical axis of the transfer device forms a z-axis and in which a distance from the z-axis and a polar angle may be used as additional coordinates. A direction parallel or antiparallel to the z-axis may be considered a longitudinal direction, and a coordinate along the z-axis may be considered a longitudinal coordinate z. Any direction perpendicular to the z-axis may be considered a transversal direction, and the polar coordinate and/or the polar angle may be considered a transversal coordinate.

As further used herein, the term "evaluation device" generally refers to an arbitrary device configured for performing the named operations, preferably by using at least one data processing device and, more preferably, by using at least one processor and/or at least one application-specific integrated circuit. Thus, as an example, the at least one evaluation device may comprise at least one data processing device having a software code stored thereon comprising a number of computer commands. The evaluation device may provide one or more hardware elements for performing one or more of the named operations and/or may provide one or more processors with software running thereon for performing one or more of the named operations.

The above-mentioned operations, including determining the at least one longitudinal coordinate of the object, are performed by the at least one evaluation device. Thus, as an example, one or more of the above-mentioned relationships may be implemented in software and/or hardware, such as by implementing one or more lookup tables. Thus, as an example, the evaluation device may comprise one or more programmable devices such as one or more computers, application-specific integrated circuits (ASICs), Digital Signal Processors (DSPs), or Field Programmable Gate Arrays (FPGAs) which are configured to perform the above-mentioned evaluation, in order to determine the at least one longitudinal coordinate of the object. Additionally or alternatively, however, the evaluation device may also fully or partially be embodied by hardware.

As outlined above, by evaluating the center signal and the sum signal, the detector may be enabled to determine the at least one longitudinal coordinate of the object, including the option of determining the longitudinal coordinate of the whole object or of one or more parts thereof. In addition, however, other coordinates of the object, including one or more transversal coordinates and/or rotational coordinates, may be determined by the detector, specifically by the evaluation device. Thus, as an example, one or more transversal sensors may be used for determining at least one transversal coordinate of the object. As outlined above, the position of the at least one optical sensor from which the center signal arises may provide information on the at least one transversal coordinate of the object, wherein, as an example, a simple lens equation may be used for optical transformation and for deriving the transversal coordinate. Additionally or alternatively, one or more additional transversal sensors may be used and may be comprised by the detector. Various transversal sensors are generally known in the art, such as the transversal sensors disclosed in WO 2014/097181 A1 and/or other position-sensitive devices (PSDs), such as quadrant diodes, CCD or CMOS chips or the like. Additionally or alternatively, as an example, the detector according to the present invention may comprise one or more PSDs disclosed in R. A. Street (Ed.): *Technology and Applications of Amorphous Silicon*, Springer-Verlag Heidelberg, 2010, pp. 346-349. Other embodiments are feasible. These devices may generally also be implemented into the detector according to the present invention. As an example, a part of the light beam may be split off within the detector, by at least one beam splitting element. The split-off portion, as an example, may be guided towards a transversal sensor, such as a CCD or CMOS chip or a camera sensor, and a transversal position of a light spot generated by the split-off portion on the transversal sensor may be determined, thereby determining at least one transversal coordinate of the object. Consequently, the detector according to the present invention may either be a one-dimensional detector, such as a simple distance measurement device, or may be embodied as a two-dimensional detector or even as a three-dimensional detector. Further, as outlined above or as outlined in further detail below, by scanning a scenery or an environment in a one-dimensional fashion, a three-dimensional image may also be created. Consequently, the detector according to the present invention specifically may be one of a one-dimensional detector, a two-dimensional detector or a three-dimensional detector. The evaluation device may further be configured to determine at least one transversal coordinate x, y of the object. The evaluation device may be configured for combine the information of the longitudinal coordinate and the transversal coordinate and to determine a position of the object in space.

Additionally or alternatively to the determining of the longitudinal coordinate $z_{DPR}$ by using the depth-from-photon-ratio technique, the evaluation device may be configured for selecting at least one reflection feature of the reflection image and for assigning said reflection feature to the corresponding VCSEL. The evaluation device may be configured for determining at least one longitudinal coordinate $z_{triang}$ by using at least one triangulation method. In addition, the depth from focus or defocus method can likewise be applied. A focus measure, commonly some sort of high pass filter or high contrast search algorithm, is used to determine the focus maxima, as discussed in Subbaro, M. and Gopal, S., Depth from Defocus: A Spatial Domain Approach, International Journal of Computer Vision, 13, 3, 271-294, 1994.

The detector may further comprise one or more additional elements such as one or more additional optical elements. Further, the detector may fully or partially be integrated into at least one housing.

In a further aspect, the present invention discloses a method for determining a position of at least one object by using a detector, such as a detector according to the present invention, such as according to one or more of the embodiments referring to a detector as disclosed above or as disclosed in further detail below. Still, other types of detectors may be used. The method comprises the following method steps, wherein the method steps may be performed in the given order or may be performed in a different order. Further, one or more additional method steps may be present which are not listed. Further, one, more than one or even all of the method steps may be performed repeatedly.

The method comprises the following method steps:
Illuminating the object with at least one illumination pattern generated by at least one projector of the detector;
Determining at least one reflection image by using at least one sensor element, having a matrix of optical sensors, the optical sensors each having a light-sensitive area, wherein each optical sensor is designed to generate at least one sensor signal in response to an illumination of its respective light-sensitive area by a reflection light beam propagating from the object to the detector;
Selecting at least one reflection feature of the reflection image and assigning said reflection feature of the reflection image to one of the VCSELs of the array.

For details, options and definitions, reference may be made to the detector as discussed above. Thus, specifically, as outlined above, the method comprises using the detector according to the present invention, such as according to one or more of the embodiments given above or given in further detail below.

The method further may comprise determining at least one longitudinal coordinate $z_{DPR}$ of the selected reflection feature of the reflection image by evaluating a combined signal Q from the sensor signals of the sensor element. The combined signal Q is derived by one or more of dividing the sensor signals, dividing multiples of the sensor signals, dividing linear combinations of the sensor signals. The longitudinal coordinate $z_{DPR}$ is determined by using at least one predetermined relationship between the combined signal Q and the longitudinal coordinate $z_{DPR}$.

The method may further comprise determining a longitudinal coordinate $z_{triang}$ of the selected reflection feature of the reflection image. The selected reflection feature may be assigned to the corresponding VCSEL. The longitudinal coordinate $z_{triang}$ may be determined by using at least one triangulation method. In addition, the depth from focus or defocus method can likewise be applied. A focus measure, commonly some sort of high pass filter or high contrast search algorithm, is used to determine the focus maxima, as discussed in Subbaro, M. and Gopal, S., Depth from Defocus: A Spatial Domain Approach, International Journal of Computer Vision, 13, 3, 271-294, 1994.

In a further aspect of the present invention, use of the detector according to the present invention, such as according to one or more of the embodiments given above or given in further detail below, is proposed, for a purpose of use, selected from the group consisting of: a position measurement in traffic technology; an entertainment application; a security application; a surveillance application; a safety application; a human-machine interface application; a tracking application; a photography application; an imaging application or camera application; a mapping application for generating maps of at least one space; a homing or tracking beacon detector for vehicles; an outdoor application; a mobile application; a communication application; a machine vision application; a robotics application; a quality control application; a manufacturing application; a gait monitoring application; a human body monitoring application; home care; smart living.

With respect to further uses of the detector and devices of the present invention reference is made to WO 2018/091649 A1, WO 2018/091638 A1 and WO 2018/091640 A1, the content of which is included by reference.

Overall, in the context of the present invention, the following embodiments are regarded as preferred:

Embodiment 1: A projector for illuminating at least one object with at least one illumination pattern, wherein the projector comprises at least one array of vertical-cavity surface-emitting lasers (VCSELs), wherein each of the VCSELs is configured for generating at least one light beam, wherein the projector comprises at least one optical system configured for generating a characteristic beam profile for each of the light beams generated by the VCSELs of the array, wherein the beam profile of neighboring VCSELs of the array differs in lateral and/or axial direction such that light beams of the VCSELs of the array are assignable to the corresponding VCSEL in three-dimensional space.

Embodiment 2: The projector according to the preceding embodiment, wherein the optical system comprises at least one array of optical elements, wherein each of the optical elements has a structured surface.

Embodiment 3: The projector according to the preceding embodiment, wherein the structured surfaces of the optical elements differ.

Embodiment 4: The projector according to any one of the preceding embodiments, wherein the optical elements are refractive optical elements, preferably refractive-diffractive hybrid-elements.

Embodiment 5: The projector according to any one of the preceding embodiments, wherein the beam profiles of neighboring VCSELs of the array differ by one or more of shape, orientation, cross section.

Embodiment 6: The projector according to any one of the preceding embodiments, wherein the optical system is configured for generating different features in lateral dimension.

Embodiment 7: The projector according to any one of the preceding embodiments, wherein the optical system is configured for generating a plurality of different illumination patterns in axial dimension.

Embodiment 8: The projector according to the preceding embodiment, wherein the optical system is configured for focusing the different illumination patterns for each VCSEL on different depth of fields.

Embodiment 9: The projector according to any one of the preceding embodiments, wherein the VCSELs are configured for emitting light beams at a wavelength range from 800 to 1000 nm, preferably at 940 nm.

Embodiment 10: The projector according to any one of the preceding embodiments, wherein the array of VCSELs is a two-dimensional or one dimensional array, wherein the array comprises up to 2500 VCSELs.

Embodiment 11: A detector for determining a position of at least one object, the detector comprising:
    at least one projector for illuminating the object with at least one illumination pattern according to any one of the preceding embodiments;
    at least one sensor element having a matrix of optical sensors, the optical sensors each having a light-sensitive area, wherein each optical sensor is designed to generate at least one sensor signal in response to an illumination of its respective light-sensitive area by a reflection light beam propagating from the object to the detector, wherein the sensor element is configured to determine at least one reflection image;
    at least one evaluation device, wherein the evaluation device is configured for selecting at least one reflection feature of the reflection image and for assigning said reflection feature to one of the VCSELs of the array.

Embodiment 12: The detector according to the preceding embodiment, wherein the evaluation device is configured for determining at least one longitudinal coordinate $z_{DPR}$ of the selected reflection feature of the reflection image by evaluating a combined signal Q from the sensor signals of the sensor element, wherein the evaluation device is configured for deriving the combined signal Q by one or more of dividing the sensor signals, dividing multiples of the sensor signals, dividing linear combinations of the sensor signals, wherein the evaluation device is configured for using at least one predetermined relationship between the combined signal Q and the longitudinal coordinate $z_{DPR}$ for determining the longitudinal coordinate.

Embodiment 13: The detector according to any one of the preceding embodiments referring to a detector, wherein the evaluation device is configured for selecting at least one reflection feature of the reflection image and for assigning said reflection feature to the corresponding VCSEL, wherein the evaluation device is configured for determining at least one longitudinal coordinate $z_{triang}$ by using at least one triangulation method.

Embodiment 14: A method for determining a position of at least one object by using at least one detector according to any one of the preceding embodiments referring to a detector, the method comprising the following steps:
    Illuminating the object with at least one illumination pattern generated by at least one projector of the detector;
    Determining at least one reflection image by using at least one sensor element, having a matrix of optical sensors, the optical sensors each having a light-sensitive area, wherein each optical sensor is designed to generate at least one sensor signal in response to an illumination of its respective light-sensitive area by a reflection light beam propagating from the object to the detector;
    Selecting at least one reflection feature of the reflection image and assigning said reflection feature of the reflection image to one of the VCSELs of the array.

Embodiment 15: The method according to the preceding embodiment, wherein the method further comprises determining at least one longitudinal coordinate $z_{DPR}$ of the selected reflection feature of the reflection image by evaluating a combined signal Q from the sensor signals of the sensor element, wherein the combined signal Q is derived by one or more of dividing the sensor signals, dividing multiples of the sensor signals, dividing linear combinations of the sensor signals, wherein the longitudinal coordinate $z_{DPR}$ is determined by using at least one predetermined relationship between the combined signal Q and the longitudinal coordinate $z_{DPR}$.

Embodiment 16: The method according to any one of the two preceding embodiments, wherein the method further comprises assigning the selected reflection feature to the corresponding VCSEL and determining at least one longitudinal coordinate $z_{triang}$ by using at least one triangulation method.

Embodiment 17: A use of the detector according to any one of the preceding embodiments referring to a detector, for a purpose of use, selected from the group consisting of: a position measurement in traffic technology; an entertainment application; a security application; a surveillance application; a safety application; a human-machine interface application; a logistics application; a tracking application; an outdoor application; a mobile application; a communication application; a photography application; a machine vision application; a robotics application; a quality control application; a manufacturing application; a gait monitoring application; a human body monitoring application; home care; smart living.

BRIEF DESCRIPTION OF THE FIGURES

Further optional details and features of the invention are evident from the description of preferred exemplary embodiments which follows in conjunction with the dependent claims. In this context, the particular features may be implemented in an isolated fashion or in combination with other features. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

DETAILED DESCRIPTION OF THE EMBODIMENTS

Figure 1:
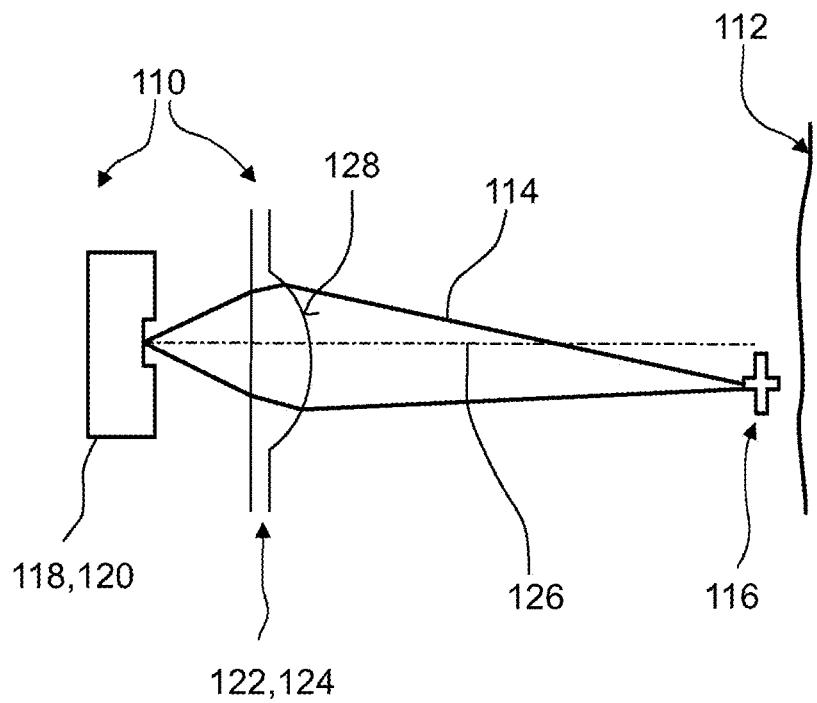
FIG. 1 shows an embodiment of a projector according to the present invention.

FIG. 1 shows in a highly schematic fashion a first embodiment of a projector 110 for illuminating at least one object 112 with at least one illumination pattern 114.

The illumination pattern 114 may comprise a plurality of features 116. The illumination pattern 114 may comprise an arrangement of periodic or non-periodic features. The illumination pattern 114 may comprise at least one pattern selected from the group consisting of: at least one point pattern, in particular a pseudo-random point pattern; a random point pattern or a quasi random pattern; at least one Sobol pattern; at least one quasiperiodic pattern; at least one pattern comprising at least one pre-known feature at least one regular pattern; at least one triangular pattern; at least one hexagonal pattern; at least one rectangular pattern at least one pattern comprising convex uniform tilings; at least one line pattern comprising at least one line; at least one line pattern comprising at least two lines such as parallel or crossing lines. For example, the projector 110 may be configured for generate and/or to project a cloud of points or non-point-like features. For example, the projector 110 may be configured for generate a cloud of points or non-point-like features such that the illumination pattern 114 may comprise a plurality of point features or non-point-like features. The illumination pattern 114 may comprise regular and/or constant and/or periodic patterns such as a triangular pattern, a rectangular pattern, a hexagonal pattern, or a pattern comprising further convex tilings. The illumination pattern may comprise as many features per area as possible such that a hexagonal pattern may be preferred. A distance between two features of the respective illumination pattern 114 and/or an area of the at least one illumination feature may depend on a circle of confusion in an image determined by at least one detector as described below.

The projector 110 comprises at least one array 118 of vertical-cavity surface-emitting lasers (VCSELs) 120. Each of the VCSELs 120 is configured for generating at least one light beam. The VCSELs 120 may be configured for emitting light beams at a wavelength range from 800 to 1000 nm. For example, the VCSELs 120 may be configured for emitting light beams at 808 nm, 850 nm, 940 nm, or 980 nm. Preferably the VCSELs 120 emit light at 940 nm, since terrestrial sun radiation has a local minimum in irradiance at this wavelength, e.g. as described in CIE 085-1989 "Solar spectral Irradiance".

The array 118 of VCSELs 120 may be a two-dimensional or one dimensional array. The array 118 of VCSELs 120 may comprise a plurality of VCSELs arranged in a matrix. The matrix specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point. For example, the matrix may be a single row of pixels. Other arrangements are feasible. The VCSELs 120 may be arranged on a common substrate or on different substrates. The array 118 may comprise up to 2500 VCSELs. For example, the array 118 may comprise 38×25 VCSELs 120, such as a high power array with 3.5 W. For example, the array 118 may comprise 10×27 VCSELs 120 with 2.5 W. For example, the array 118 may comprise 96 VCSELs 120 with 0.9 W. A size of the array 118, e.g. of 2500 elements, may be up to 2 mm×2 mm.

The array 118 of VCSEL 120 may have in comparison to light emitting diodes (LEDs) a high radiant power. Moreover, the VCSELs 120 may have higher spatial and temporal coherence in comparison to LEDs. This may allow improved shaping and/or modifying of the beam profile by the optical system and an increased spectral power density.

The projector 110 comprises at least one optical system 122 configured for generating a characteristic beam profile for each of the light beams generated by the VCSELs 120 of the array 118. The optical system 122 may comprise at least one array of optical elements 124. The array of optical elements 124 may comprise a plurality of optical elements arranged in a matrix. The matrix of optical elements 124 specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point. For example, the matrix may be a single row of pixels. Other arrangements are feasible.

The beam profile may be a transverse intensity profile of the light beam. The beam profile may be a cross section of the light beam. The beam profile may be selected from the group consisting of a trapezoid beam profile; a triangle beam profile; a conical beam profile and a linear combination of Gaussian beam profiles. Other embodiments are feasible, however. The beam profile of neighboring VCSELs of the array differs in lateral and/or axial direction. The axial direction may be a direction along an optical axis 126 of the optical system 122, in particular a longitudinal direction. The optical axis 126 may be a line of symmetry of the optical setup of the optical system 122. The lateral direction may be a direction perpendicular to the axial direction, in particular a transversal direction. The beam profiles of VCSELs 120 of the array 118, in particular of neighboring VCSELs of the array, may differ by one or more of shape, orientation, cross section. The different beam profiles allow assigning light beams generated by the VCSELs 120 of the array 118 to the corresponding VCSEL. In particular, if neighboring light beams differ in shape, it is possible to determine from which VCSEL 120 of the array 118 a light beam was generated from the shape of the light beam. For example, the light beams may differ in shape and orientation. Preferably, the differences of the beam profiles are as large as possible in order to allow simple assignment. The assignment may be simplest, in case the beam profiles of all VCSELs 120 of the array differ 118 in shape, orientation and cross section. However, it may be sufficient that beam profiles of neighbouring light beams differ in at least one parameter.

Each of the optical elements 124 may have a structured surface 128. The structured surfaces 128 of the optical elements 124 may differ. In particular, the structured surfaces 128 of two neighboring optical elements of the array may differ. The optical elements 124 may be manufactured or produced by using three-dimensional holographic lithography, such as described in J. Gavin in Optics Letters, Vol. 36 (2011), Nr. 13, 2495-2497.

The optical elements 124 each may be or may comprise at least one lens having a structured surface 128, in particular with an individual imprinted and/or embossed structure.

However, other manufacturing techniques such as molding or injection molding are possible. The structured surface 128 may result in that a light beam impinging on the optical element is adjusted to have a non-pointlike or non-punctiform beam profile. The optical elements 124 may be refractive optical elements. Preferably, the optical elements 124 may be refractive-diffractive hybrid-elements. The refractive elements and/or refractive structures may have a radius, in particular a diameter of e.g. a micro lens, depending on the distance between neighboring VCSELs 120. For example, the distance may range from 40 µm to 70 µm. The diameter may be similar such as 40 µm. However, the diameter may furthermore depend strongly on optical properties and refractive index. The diffractive elements and/or diffractive structures may be advantageous since they can be produced very flat. The diffractive elements each may comprise at least one base plate, also denoted as substrate. The base plate may be a glass base plate. The base plate may have a thickness of 1 mm. The refractive elements and/or refractive structures may have a thickness $D_{diff}$, which corresponds to the phase difference of $2\pi$ due to the optical path difference $$D_{diff} = (n-1)\frac{\lambda}{2\pi}.$$

The diameter of the diffractive and refractive elements and/or structures may be smaller than the distance between two VCSELs 120 of the array 118, e.g. the diameter may be smaller than 70 µm. The diffractive elements and/or structures may be circular symmetrical and planar. However, non-symmetrical embodiments are possible. For example, diffractive structures may be arranged on a curved surface such as of a concave or convex side of a refractive lens.

The optical elements 124 may comprise at least one material comprising at least one polymer. The material may be a polymer material which may be used for 2-photon stimulation polymerization such as Nanoscribe IP-Dip, OrmoComp., Nanoscribe IP-G, Nanoscribe IP-L, Nanoscribe IP-S. For molding process, such as injection molding or hot embosing and the like, plastics may be used such as available from Zeonix, https://www.zeonex.com/optics.aspx.html, or Trogamid myCX from Evonik, https://www.campusplastics.com/campus/de/datasheet/TROGA-MID%C2%AE+myCX+nc+(nf)/Evonik+Industries+AG/66/bf801790. For glass molding several glass materials can be used such as glass materials listed in https://refractiveindex.info/?shelf=glass&book=BK7&page=SCHOTT.

The optical elements 124 may be arranged as close as possible in a direction of propagation of the light beams in front of the array 118 of VCSELs 120. For example, the optical elements 124 may be designed as rod lenses having a high refractive index. The rod lenses may be arranged as close as possible in a direction of propagation of the light beams in front of the array of VCSELs 120. Due to the higher refractive index of the lens material a convergence angle may be reduced and the optical path length may be increased such that local coherence is increased allowing improved shaping of the light beam.

Figure 3:
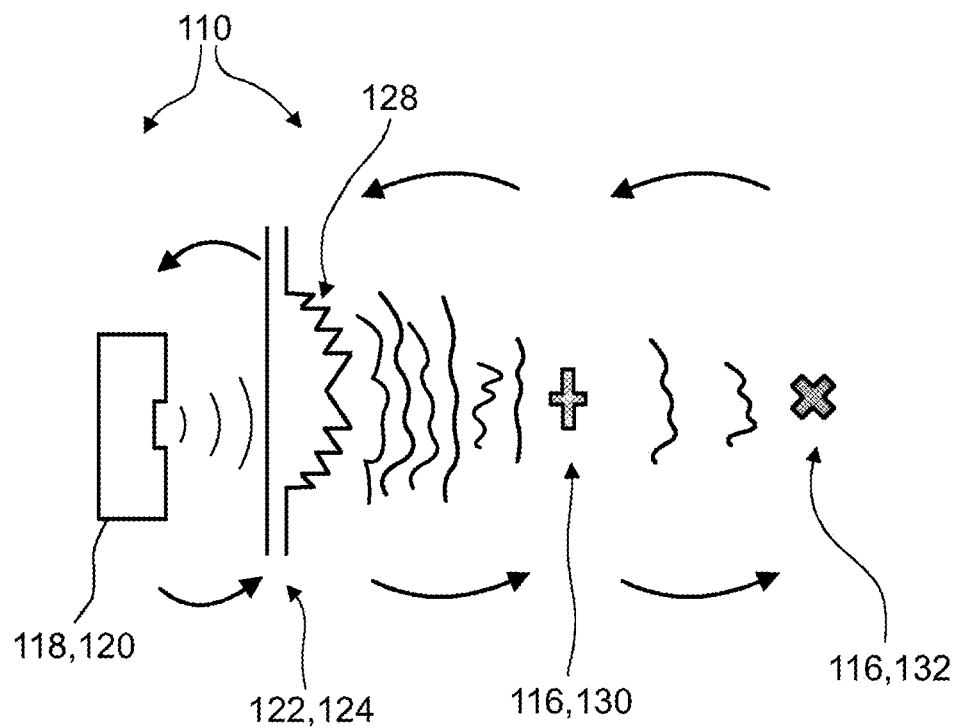
FIG. 3 shows a further embodiment of the projector.

The structured surface 128 may be configured such that the cross section of the beam profile may differ dependent on distance between the projector 110 and the object 112, as shown in FIG. 3. In FIG. 3 exemplarily two different symbols are depicted denoting features of different shape depending on distance from the optical element 124. Propagation and changes in beam profile shape are depicted highly schematically, too. This may be ensured by using optical elements 124 having a specific pre-defined and/or pre-determined geometry. The required geometry may be determined by using an iterative wave-optical calculation, denoted with arrows in FIG. 3. In particular, desired intensity distributions at different distances with respect to the optical elements 124 may be used as a basis of the iterative design. Between different planes, e.g. VCSEL 120, optical element 124, projection plane with shape 1, denoted with reference number 130, and projection plane with shape 2, projection plane with shape 1, denoted with reference number 132, at least one wave-optical propagation algorithm such as Fresnel propagation, or Rayleigh-Sommerfeld diffraction integral, may be used. Said propagation may run from plane to plane and back to the VCSEL 120. Since the VCSEL 120 may emit partial coherent radiation, it is possible for using point-light sources for simulation which are non-coherent between each other. Said point-light sources may be weighted with respect to their intensity distribution.

Figure 6:
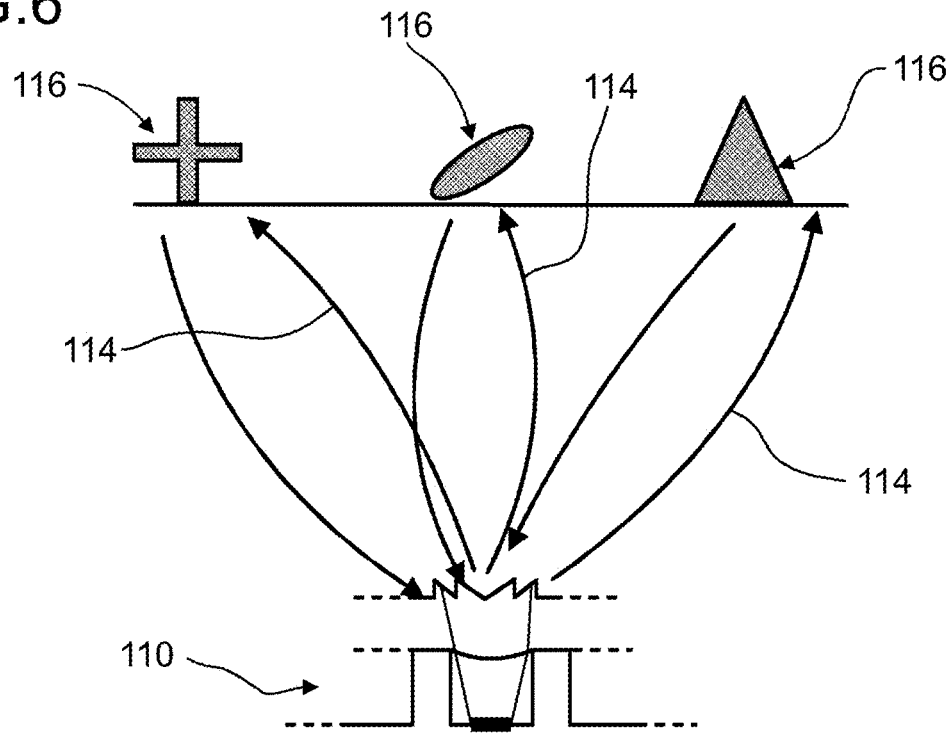
FIG. 6 shows a further embodiment of the projector; and,
FIG. 7 shows a further embodiment of the projector.
Figure 7:
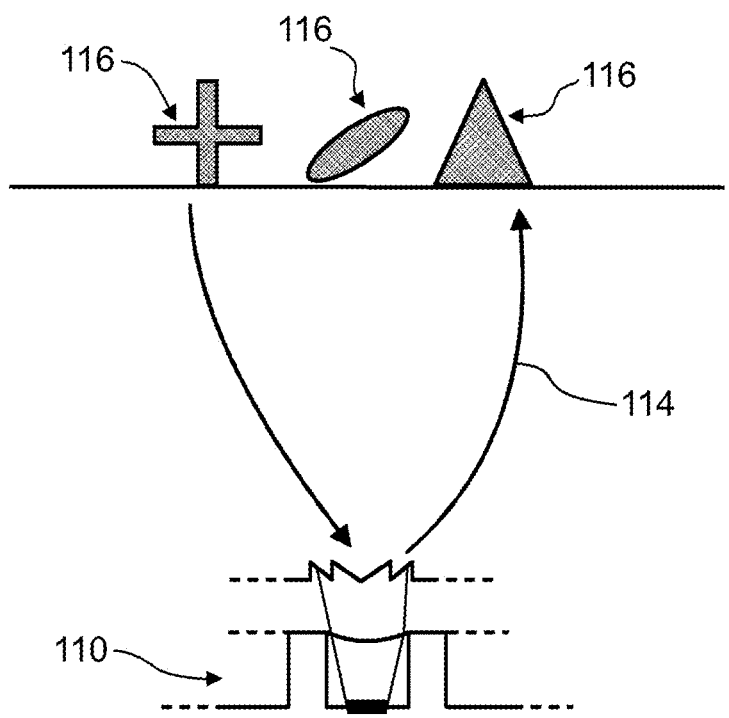

The optical system 122 may be configured for generating a plurality of illumination patterns 114 in lateral dimension. For example, the optical system 122 may be configured for generating for each of the VCSELs 120 of the array 118 at least two illumination features 116 having different angles with respect to the optical axis 126. For example, this can be realized using raytracing routines such as enabled by the commercial software package from Zemax®. Additionally or alternatively, it may be possible to use an iterative approach based on at least one wave-optical propagation method such as Rayleigh-Sommerfeld, Fresnel propagation and/or Fraunhofer propagation. The iterative process then may alternate between the propagation from the optical system to the different laterally projected illumination patterns and back to the optical system. During an update process of the optical system the number of the different lateral illumination patterns may be accounted resulting in a certain percentage that each illumination pattern contributes to the updated optical systems e.g. if two illumination patterns shall be produced with equal weight, the corresponding retrieved wave-optical solutions in each iterative step will contribute to the wave optical description of the optical system by 50%. This process may be repeated until the error measure could be minimized for all projected illumination patterns. The error measure may be obtained from the difference between the desired illumination pattern to the simulated illumination pattern. A projection direction between the at least two illumination patterns may not be too large. The two patterns can be projected in the same plane. Hence, the iterative process will only take place between the optical system and the plane of the desired at least two illumination patterns. FIGS. 6 and 7 show further embodiments of the projector 110. In FIG. 6 lateral pattern projection for two laterally spaced pattern 114 is shown. Specifically, FIG. 6 shows a projection-plane with different shaped patterns. FIG. 7 shows an embodiment with lateral pattern projection for three different lateral planes.

Figure 2:
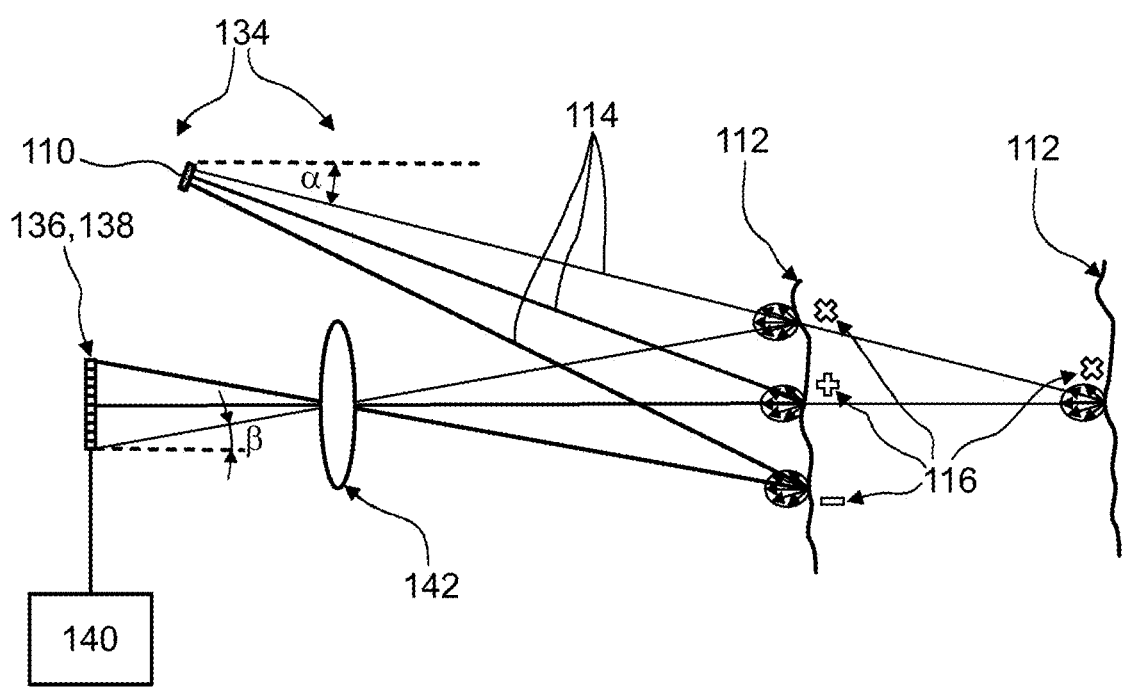
FIG. 2 shows an embodiment of a detector according to the present invention.

FIG. 2 shows highly schematically a detector 134 for determining a position of at least one object 112. The detector 134 comprises at least one projector 110 according to the present invention, such as described with respect to FIGS. 1 and 3.

The detector 134 comprises at least one sensor element 136 having a matrix of optical sensors 138. The optical sensors 138 each having a light-sensitive area. Each optical sensor 138 is designed to generate at least one sensor signal in response to an illumination of its respective light-sensitive area by a reflection light beam propagating from the object 112 to the detector 134. The sensor element 136 is configured to determine at least one reflection image. The sensor element 136 may be formed as a unitary, single device or as a combination of several devices. The matrix, as will be outlined in further detail below, specifically may be or may comprise a rectangular matrix having one or more rows and one or more columns. The rows and columns specifically may be arranged in a rectangular fashion. It shall be outlined, however, that other arrangements are feasible, such as nonrectangular arrangements. As an example, circular arrangements are also feasible, wherein the elements are arranged in concentric circles or ellipses about a center point. For example, the matrix may be a single row of pixels. Other arrangements are feasible. The light-sensitive area may specifically be located on a surface of the respective optical sensor. Other embodiments, however, are feasible. The optical sensors 138 of the matrix specifically may be equal in one or more of size, sensitivity and other optical, electrical and mechanical properties. The light-sensitive areas of all optical sensors 138 of the matrix specifically may be located in a common plane, the common plane preferably facing the object, such that a light beam propagating from the object to the detector may generate a light spot on the common plane.

The optical sensors 138 specifically may be or may comprise photodetectors, preferably inorganic photodetectors, more preferably inorganic semiconductor photodetectors, most preferably silicon photodetectors. Specifically, the optical sensors 138 may be sensitive in the infrared spectral range. All of the optical sensors 138 of the matrix or at least a group of the optical sensors of the matrix specifically may be identical. Groups of identical optical sensors of the matrix specifically may be provided for different spectral ranges, or all optical sensors may be identical in terms of spectral sensitivity. Further, the optical sensors 138 may be identical in size and/or with regard to their electronic or optoelectronic properties.

Specifically, the optical sensors 138 may be or may comprise inorganic photodiodes which are sensitive in the infrared spectral range, preferably in the range of 780 nm to 3.0 micrometers. Specifically, the optical sensors 138 may be sensitive in the part of the near infrared region where silicon photodiodes are applicable specifically in the range of 700 nm to 1000 nm. Infrared optical sensors which may be used for optical sensors may be commercially available infrared optical sensors, such as infrared optical sensors commercially available under the brand name Hertzstueck™ from trinamiX GmbH, D-67056 Ludwigshafen am Rhein, Germany. Thus, as an example, the optical sensors 138 may comprise at least one optical sensor of an intrinsic photovoltaic type, more preferably at least one semiconductor photodiode selected from the group consisting of: a Ge photodiode, an InGaAs photodiode, an extended InGaAs photodiode, an InAs photodiode, an InSb photodiode, a HgCdTe photodiode. Additionally or alternatively, the optical sensors 138 may comprise at least one optical sensor of an extrinsic photovoltaic type, more preferably at least one semiconductor photodiode selected from the group consisting of: a Ge:Au photodiode, a Ge:Hg photodiode, a Ge:Cu photodiode, a Ge:Zn photodiode, a Si:Ga photodiode, a Si:As photodiode. Additionally or alternatively, the optical sensors 138 may comprise at least one bolometer, preferably a bolometer selected from the group consisting of a VO bolometer and an amorphous Si bolometer.

The matrix may be composed of independent optical sensors 138. Thus, a matrix may be composed of inorganic photodiodes. Alternatively, however, a commercially available matrix may be used, such as one or more of a CCD detector, such as a CCD detector chip, and/or a CMOS detector, such as a CMOS detector chip.

The detector 134 comprises at least one evaluation device 140. The evaluation device 140 is configured for selecting at least one reflection feature of the reflection image and for assigning said reflection feature to one of the VCSELs 120 of the array 118. The reflection image may comprise the at least one reflection pattern comprising the reflection features. The evaluation device 140 may be configured for performing at least one image analysis and/or image processing in order to identify the reflection feature. The image analysis and/or image processing may use at least one feature detection algorithm. The image analysis and/or image processing may comprise one or more of the following: a filtering; a selection of at least one region of interest; a formation of a difference image between an image created by the sensor signals and at least one offset; an inversion of sensor signals by inverting an image created by the sensor signals; a formation of a difference image between an image created by the sensor signals at different times; a background correction; a decomposition into color channels; a decomposition into hue; saturation; and brightness channels; a frequency decomposition; a singular value decomposition; applying a Canny edge detector; applying a Laplacian of Gaussian filter; applying a Difference of Gaussian filter; applying a Sobel operator; applying a Laplace operator; applying a Scharr operator; applying a Prewitt operator; applying a Roberts operator; applying a Kirsch operator; applying a high-pass filter; applying a low-pass filter; applying a Fourier transformation; applying a Radon-transformation; applying a Hough-transformation; applying a wavelet-transformation; a thresholding; creating a binary image. The region of interest may be determined manually by a user or may be determined automatically, such as by recognizing an object within an image generated by the optical sensors.

The evaluation device 140 may be configured for determining, in particular unambiguously, the one VCSEL 120 of the array 118 having emitted the illumination feature 116 having caused the selected reflection feature. In known 3D sensing devices, such as devices using triangulation or structured light techniques, solving this correspondence problem is complex and time consuming. The present invention proposes using characteristic, in particular distinguishable, beam profiles for the illumination features and, thus, for the reflection features such that it is possible to identify the one VCSEL 120 of the array 118 having emitted the illumination feature having caused the selected reflection feature immediately, easily and unambiguously.

The detector 134 may be configured for determining at least one distance information of the object by using triangulation and/or depth from photon ratio technique and/or depth from focus and/or depth from defocus. For example, the evaluation device 140 may be configured for determining at least one longitudinal coordinate $z_{DPR}$ of the selected reflection feature of the reflection image by evaluating a combined signal Q from the sensor signals of the sensor element 136. The evaluation device 140 may be configured for deriving the combined signal Q by one or more of dividing the sensor signals, dividing multiples of the sensor signals, dividing linear combinations of the sensor signals. The evaluation device 140 may be configured for using at least one predetermined relationship between the combined signal Q and the longitudinal coordinate $z_{DPR}$ for determining the longitudinal coordinate.

The detector 134 may comprise at least one further optical element 142 selected from the group consisting of: transfer device, such as at least one lens and/or at least one lens system, at least one diffractive optical element. The transfer device may be configured for guide the light beam onto the optical sensors 138. The transfer device specifically may comprise one or more of: at least one lens, for example at least one lens selected from the group consisting of at least one focus-tunable lens, at least one aspheric lens, at least one spheric lens, at least one Fresnel lens; at least one diffractive optical element; at least one concave mirror; at least one beam deflection element, preferably at least one mirror; at least one beam splitting element, preferably at least one of a beam splitting cube or a beam splitting mirror; at least one multi-lens system. The transfer device may comprise one or more imaging elements which can have the effect of a converging lens. By way of example, the transfer device can have one or more lenses, in particular one or more refractive lenses, and/or one or more convex mirrors. In this example, the focal length may be defined as a distance from the center of the thin refractive lens to the principal focal points of the thin lens. For a converging thin refractive lens, such as a convex or biconvex thin lens, the focal length may be considered as being positive and may provide the distance at which a beam of collimated light impinging the thin lens as the transfer device may be focused into a single spot. Additionally, the transfer device can comprise at least one wavelength-selective element, for example at least one optical filter. Additionally, the transfer device can be designed to impress a predefined beam profile on the electromagnetic radiation, for example, at the location of the sensor region and in particular the sensor area. The abovementioned optional embodiments of the transfer device can, in principle, be realized individually or in any desired combination.

The transfer device may have an optical axis. In particular, the detector 134 and the transfer device have a common optical axis. The optical axis of the detector may be a line of symmetry of the optical setup of the detector 134. The detector 134 comprises at least one transfer device, preferably at least one transfer system having at least one lens. The transfer system, as an example, may comprise at least one beam path, with the elements of the transfer system in the beam path being located in a rotationally symmetrical fashion with respect to the optical axis. Still, one or more optical elements located within the beam path may also be off-centered or tilted with respect to the optical axis. In this case, however, the optical axis may be defined sequentially, such as by interconnecting the centers of the optical elements in the beam path, e.g. by interconnecting the centers of the lenses, wherein, in this context, the optical sensors are not counted as optical elements. The optical axis generally may denote the beam path. Therein, the detector 134 may have a single beam path along which a light beam may travel from the object to the optical sensors, or may have a plurality of beam paths. As an example, a single beam path may be given or the beam path may be split into two or more partial beam paths. In the latter case, each partial beam path may have its own optical axis. The optical sensors 138 may be located in one and the same beam path or partial beam path. Alternatively, however, the optical sensors may also be located in different partial beam paths.

The transfer device may constitute a coordinate system, wherein a longitudinal coordinate l is a coordinate along the optical axis and wherein d is a spatial offset from the optical axis. The coordinate system may be a polar coordinate system in which the optical axis of the transfer device forms a z-axis and in which a distance from the z-axis and a polar angle may be used as additional coordinates. A direction parallel or antiparallel to the z-axis may be considered a longitudinal direction, and a coordinate along the z-axis may be considered a longitudinal coordinate z. Any direction perpendicular to the z-axis may be considered a transversal direction, and the polar coordinate and/or the polar angle may be considered a transversal coordinate.

Figure 4:
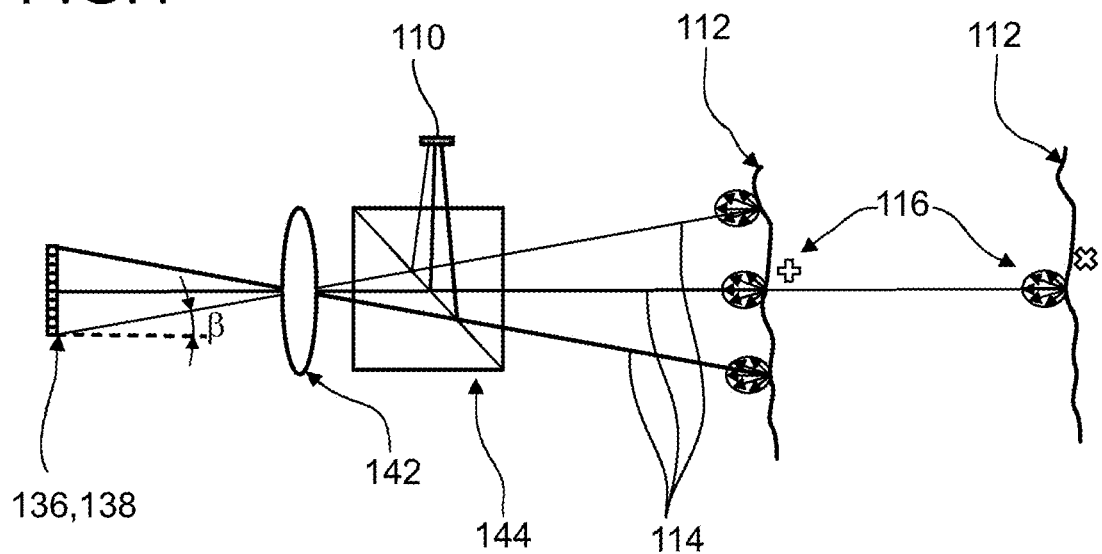
FIG. 4 shows a further embodiment of the detector.

FIGS. 2 and 4 show embodiments of the projector 110 in which the optical system 122 is configured for generating a plurality of different illumination patterns 114 in axial dimension. In FIGS. 2 and 4 exemplarily two object planes are shown. For the object plane closer to the detector 134 three different symbols are shown denoting different features 116 of the illumination pattern. For the object plane at a greater distance from the detector 134 exemplary one feature 116 is shown, wherein the feature 116 has changed from the object plane closer to the detector 134 to the object plane at the greater distance. The optical system 122 may be configured for focusing the different illumination patterns for each VCSEL on different depth of fields. Specifically, the optical system 122 may be configured for focusing the illumination patterns 114 at different focus planes, in particular object planes, wherein the focus planes are planes perpendicular to the optical axis 126 of the optical system 122 having different coordinates along the optical axis. The optical system 122 may be configured such that in each of the focus planes only one illumination pattern 114 of the illumination patterns 114 is focused, whereas the other illumination patterns 114 are non-focused. In FIG. 4, in addition, an embodiment using a beam splitting device 144 is shown.

Figure 5:
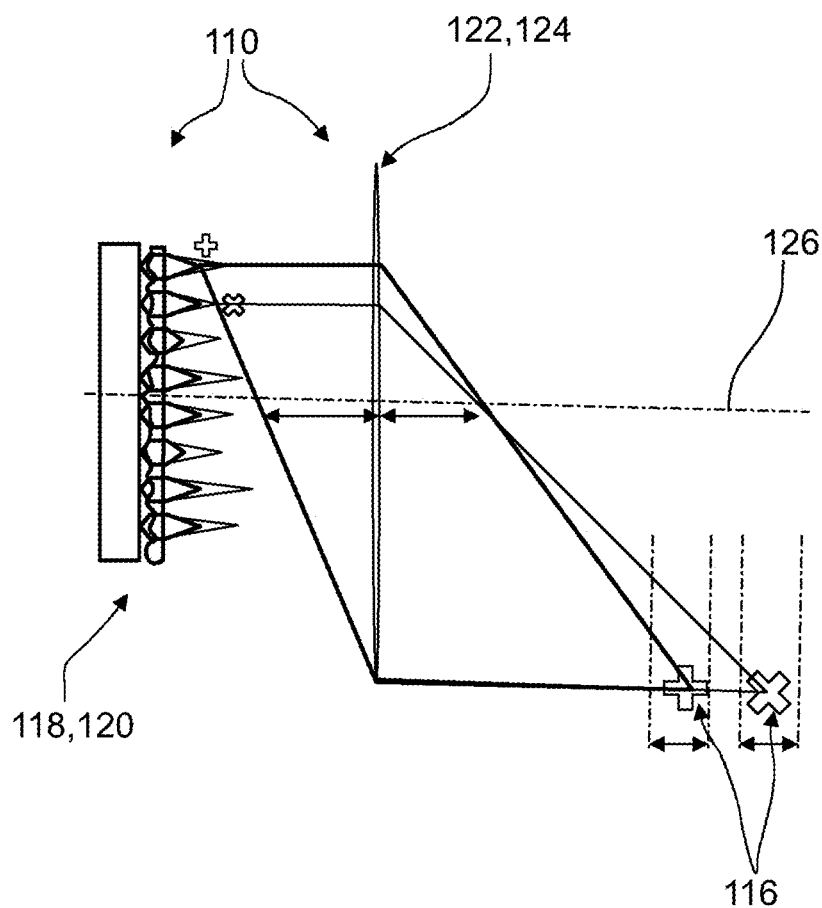
FIG. 5 shows a further embodiment of the projector.

As shown in FIG. 5, the optical system 122 may be configured such that in each of the focus planes a different illumination pattern 114 is focused. The optical system 122 may comprise at least one device for intermediate projection of the illumination pattern. For example, for application with distances of a few meters between the array 118 of VCSELs 120 and the object 112, the device for intermediate projection may be designed as telecentric imaging, such that the size of the features of the imaged pattern is unchanged for all axial object positions. Additionally or alternatively, imaging scales may be determined from design data or by calibration. The plurality of different illumination patterns 114 in axial dimension may allow using triangulation methods and/or methods at which detector 134 and projector 110 are aligned, in particular on a common axis. For this purpose, the detector 134 may comprises at least one zoom optics and/or at least one electro-optical tunable system for traversing the measuring range. By adjusting the different illumination patterns for different depths of the VCSELs 120 of the array 118, it may be possible to increase the number of distinguishable depth steps over the depth of field range of the detector 134 to the number of VCSELs 120 in the array 118.

LIST OF REFERENCE NUMBERS 110 projector
112 object
114 illumination pattern
116 illumination features
118 array
120 VCSEL
122 optical system
124 optical element
126 optical axis
128 structured surface 130 projection plane
132 projection plane
134 detector
136 sensor element
138 optical sensor
140 evaluation device
142 further optical element
144 beam splitting device

The invention claimed is:

1. A projector for illuminating at least one object with at least one illumination pattern, wherein the projector comprises at least one array of vertical-cavity surface-emitting lasers (VCSELs), wherein each of the VCSELs is configured for generating at least one light beam, wherein the projector comprises at least one optical system configured for generating a characteristic beam profile for each of the light beams generated by the VCSELs of the array, wherein the beam profile of neighboring VCSELs of the array differs in lateral and/or axial direction such that light beams of the VCSELs of the array are assignable to the corresponding VCSEL in three-dimensional space;
wherein the optical system is configured for generating a plurality of different illumination patterns in the axial dimension;
wherein the optical system is configured for focusing the different illumination patterns for each VCSEL on different depth of fields.

2. The projector according to claim 1, wherein the optical system comprises at least one array of optical elements, wherein each of the optical elements has a structured surface.

3. The projector according to claim 2, wherein the structured surfaces of the optical elements differ.

4. The projector according to claim 1, wherein the optical elements are refractive optical elements.

5. The projector according to claim 1, wherein the beam profiles of neighboring VCSELs of the array differ by one or more of shape, orientation, cross section.

6. The projector according to claim 1, wherein the optical system is configured for generating different features in the lateral dimension.

7. The projector according to claim 1, wherein the VCSELs are configured for emitting light beams at a wavelength range from 800 to 1000 nm.

8. A detector for determining a position of at least one object, the detector comprising:
at least one projector for illuminating the object with at least one illumination pattern according to claim 1;
at least one sensor element having a matrix of optical sensors, the optical sensors each having a light-sensitive area, wherein each optical sensor is designed to generate at least one sensor signal in response to an illumination of its respective light-sensitive area by a reflection light beam propagating from the object to the detector, wherein the sensor element is configured to determine at least one reflection image;
at least one evaluation device, wherein the evaluation device is configured for selecting at least one reflection feature of the reflection image and for assigning said reflection feature to one of the VCSELs of the array.

9. The detector according to claim 8, wherein the evaluation device is configured for determining at least one longitudinal coordinate zDPR of the selected reflection feature of the reflection image by evaluating a combined signal Q from the sensor signals of the sensor element, wherein the evaluation device is configured for deriving the combined signal Q by one or more of dividing the sensor signals, dividing multiples of the sensor signals, dividing linear combinations of the sensor signals, wherein the evaluation device is configured for using at least one predetermined relationship between the combined signal Q and the longitudinal coordinate zDPR for determining the longitudinal coordinate.

10. The detector according to claim 8, wherein the evaluation device is configured for selecting at least one reflection feature of the reflection image and for assigning said reflection feature to the corresponding VCSEL, wherein the evaluation device is configured for determining at least one longitudinal coordinate ztriang by using at least one triangulation method.

11. A method for determining a position of at least one object by using at least one detector according to claim 10, the method comprising the following steps:
illuminating the object with at least one illumination pattern generated by at least one projector of the detector;
determining at least one reflection image by using at least one sensor element, having a matrix of optical sensors, the optical sensors each having a light-sensitive area, wherein each optical sensor is designed to generate at least one sensor signal in response to an illumination of its respective light-sensitive area by a reflection light beam propagating from the object to the detector; and
selecting at least one reflection feature of the reflection image and assigning said reflection feature of the reflection image to one of the VCSELs of the array.

12. A method of using the detector according to claim 8, for a purpose of use selected from the group consisting of: a position measurement in traffic technology; an entertainment application; a security application; a surveillance application; a safety application; a human-machine interface application; a logistics application; a tracking application; an outdoor application; a mobile application; a communication application; a photography application; a machine vision application; a robotics application; a quality control application; a manufacturing application; a gait monitoring application; a human body monitoring application; home care; and smart living.

13. The projector according to claim 1, wherein the optical elements are refractive-diffractive hybrid-elements.

14. The projector according to claim 1, wherein the VCSELs are configured for emitting light beams at 940 nm.

* * * * *